US009711716B2

(12) United States Patent
Son et al.

(10) Patent No.: US 9,711,716 B2
(45) Date of Patent: Jul. 18, 2017

(54) MAGNETIC MEMORY DEVICE AND METHOD FOR MANUFACTURING THE SAME

(71) Applicants:Myoungsu Son, Seoul (KR); Kiseok Suh, Hwaseong-si (KR); Gwanhyeob Koh, Seoul (KR); KyungTae Nam, Suwon-si (KR); Yoonjong Song, Hwaseong-si (KR)

(72) Inventors: Myoungsu Son, Seoul (KR); Kiseok Suh, Hwaseong-si (KR); Gwanhyeob Koh, Seoul (KR); KyungTae Nam, Suwon-si (KR); Yoonjong Song, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/246,519

(22) Filed: Aug. 24, 2016

(65) Prior Publication Data

US 2017/0092852 A1    Mar. 30, 2017

(30) Foreign Application Priority Data

Sep. 25, 2015    (KR) .......................... 10-2015-0136182

(51) Int. Cl.
*H01L 43/12*    (2006.01)
*H01L 27/22*    (2006.01)
(Continued)

(52) U.S. Cl.
CPC ............ *H01L 43/12* (2013.01); *H01L 27/224* (2013.01); *H01L 43/02* (2013.01); *H01L 43/08* (2013.01)

(58) Field of Classification Search
CPC ....... H01L 43/12; H01L 27/224; H01L 43/00; H01L 27/228; H01L 43/02; H01L 43/10; H01L 43/08
See application file for complete search history.

(56) References Cited

U.S. PATENT DOCUMENTS 8,486,789 B2    7/2013    Okazaki
2008/0185661 A1    8/2008    Takeoka
(Continued)

FOREIGN PATENT DOCUMENTS

JP    2008130931 A    6/2008
KR    100373788 B1    2/2003
(Continued)

*Primary Examiner* — Savitr Mulpuri
(74) *Attorney, Agent, or Firm* — Renaissance IP Law Group LLP

(57) ABSTRACT

A magnetic memory device and a method for manufacturing the magnetic memory device are disclosed. The method includes forming a first interlayer insulating layer on a substrate, forming a first conductive pattern that penetrates the first interlayer insulating layer, forming a mold insulating layer that includes first and second mold insulating layers on the first interlayer insulating layer, forming a second conductive pattern that penetrates the first and second mold insulating layers and the first interlayer insulating layer, and forming a magnetic tunnel junction pattern on the second conductive pattern. The first mold insulating layer is in contact with the first conductive pattern, and the second mold insulating layer is disposed on the first mold insulating layer.

16 Claims, 13 Drawing Sheets

(51) Int. Cl.
   *H01L 43/02*    (2006.01)
   *H01L 43/08*    (2006.01)

(56) References Cited

U.S. PATENT DOCUMENTS

| | | |
|---|---|---|
| 2008/0197426 A1 | 8/2008 | Okazaki |
| 2014/0273471 A1* | 9/2014 | Gwak ............... H01L 27/10852 |
| | | 438/702 |
| 2016/0336509 A1 | 11/2016 | Jeong et al. |
| 2017/0040531 A1* | 2/2017 | Chung .................... H01L 43/12 |
| 2017/0053965 A1* | 2/2017 | Baek ..................... H01L 27/228 |
| 2017/0092851 A1* | 3/2017 | Han ........................ H01L 43/12 |

FOREIGN PATENT DOCUMENTS

| | | |
|---|---|---|
| KR | 20050009400 A | 1/2005 |
| KR | 20060011384 A | 2/2006 |
| KR | 100587602 B1 | 6/2006 |
| KR | 20160135044 A | 11/2016 |

* cited by examiner

MAGNETIC MEMORY DEVICE AND METHOD FOR MANUFACTURING THE SAME

CROSS-REFERENCE TO RELATED APPLICATION

This U.S. non-provisional patent application claims priority under 35 U.S.C. §119 to Korean Patent Application No. 10-2015-0136182, filed on Sep. 25, 2015, in the Korean Intellectual Property Office, the disclosure of which is hereby incorporated by reference in its entirety.

BACKGROUND

The inventive concepts relate to a semiconductor device and a method for manufacturing the semiconductor device and, more particularly, to a memory device including a magnetic tunnel junction (MTJ) pattern and a method for manufacturing the same.

As high-speed and low-power electronic products have become in great demand, high-speed and low-voltage memory devices installed in the high-speed and low-power electronic device have also become in great demand. Magnetic memory devices have been developed to satisfy the demand for high-speed and low-voltage memory devices. Magnetic memory devices may provide high-speed and/or non-volatile characteristics, and may be focused on as next-generation memory devices.

A magnetic memory device may be a memory device that uses a magnetic tunnel junction (MTJ) pattern. A MTJ pattern may include two magnetic layers and an insulating layer disposed between the two magnetic layers. A resistance value of the MTJ pattern may be changed based on magnetization directions of the two magnetic layers. The MTJ pattern may have a relatively large value of resistance if the magnetization directions of the two magnetic layers are anti-parallel to each other. Conversely, the MTJ pattern may have a relatively small value of resistance if the magnetization directions of the two magnetic layers are parallel to each other. The magnetic memory device may write/sense data based on a difference in resistance values of the MTJ pattern.

A spin transfer torque-magnetic random access memory (STT-MRAM) device, in particular, may have a write current that decreases in magnitude as a size of a magnetic cell decreases. Accordingly, a STT-MRAM device may be focused on as a highly integrated, high-speed, low-voltage memory device.

SUMMARY

Embodiments of the inventive concepts may provide a magnetic memory device with improved electrical characteristics.

Embodiments of the inventive concepts may also provide a method for manufacturing a magnetic memory device with improved electrical characteristics.

In an aspect, a method for manufacturing a magnetic memory device may include forming a first interlayer insulating layer on a substrate, forming a first conductive pattern that penetrates the first interlayer insulating layer, forming a mold insulating layer on the first interlayer insulating layer, the mold insulating layer includes a first mold insulating layer that is in contact with the first conductive pattern and a second mold insulating layer on the first mold insulating layer, forming a second conductive pattern that penetrates the first and second mold insulating layers and the first interlayer insulating layer, and forming a magnetic tunnel junction pattern on the second conductive pattern. The first mold insulating layer may be formed by a first process at a first temperature, and the second mold insulating layer may be formed by a second process that is different from the first process at a second temperature that is greater than the first temperature. The first temperature may be about room temperature.

In some embodiments, the first process may be an atomic layer deposition (ALD) process, and the second process may be a chemical vapor deposition (CVD) process.

In some embodiments, the second temperature may range from about 300° C. to about 500° C.

In some embodiments, the first conductive pattern may extend from a top surface to a bottom surface of the first interlayer insulating layer.

In some embodiments, the second conductive pattern may extend from a top surface of the second mold insulating layer to the bottom surface of the first interlayer insulating layer.

In some embodiments, the method may further include forming a second interlayer insulating layer that covers the magnetic tunnel junction pattern on the second mold insulating layer, and forming a third conductive pattern that penetrates the second interlayer insulating layer, the second mold insulating layer and the first mold insulating layer to be in contact with the first conductive pattern.

In some embodiments, the first conductive pattern and the third conductive pattern may include metals that are different from each other.

In some embodiments, the metal of the third conductive pattern may have a lower melting point and a lower resistivity than the metal of the first conductive pattern.

In some embodiments, the first conductive pattern may include tungsten, and the third conductive pattern may include copper.

In some embodiments, the second conductive pattern may include the same metal as the first conductive pattern.

In some embodiments, the method may further include forming a bottom electrode between the second conductive pattern and the magnetic tunnel junction pattern, and forming a top electrode on the magnetic tunnel junction pattern.

In some embodiments, the method may further include forming a connection line pattern that is in contact with the top electrode and the third conductive pattern.

In some embodiments, forming the magnetic tunnel junction pattern may include forming a first magnetic pattern that is in contact with the bottom electrode, forming a second magnetic pattern that is in contact with the top electrode, and forming a tunnel barrier pattern between the first and second magnetic patterns.

In an aspect, a magnetic memory device may include a first lower interlayer insulating layer on a substrate, a first conductive pattern disposed in the first lower interlayer insulating layer, a mold insulating layer on the first lower interlayer insulating layer, the mold insulating layer including a first mold insulating layer and a second mold insulating layer that is sequentially stacked, a second conductive pattern that penetrates the first and second mold insulating layers and the first lower interlayer insulating layer, and a first magnetic tunnel junction pattern disposed on the second mold insulating layer and electrically connected to the second conductive pattern. The first mold insulating layer and the second mold insulating layer may have thin-layer characteristics that are different from each other.

In some embodiments, each of the first and second mold insulating layers may include a silicon oxide layer.

In some embodiments, a refractive index of the first mold insulating layer may be lower than a refractive index of the second mold insulating layer.

In some embodiments, each of the first and second mold insulating layers may have a compressive stress, and a magnitude of the compressive stress of the first mold insulating layer may be smaller than a magnitude of the compressive stress of the second mold insulating layer.

In some embodiments, the first mold insulating layer and the second mold insulating layer may include materials that are different from each other.

In some embodiments, a top surface of the first conductive pattern may be disposed at a substantially same level as a top surface of the first lower interlayer insulating layer.

In some embodiments, a top surface of the second conductive pattern may be disposed at a substantially same level as a top surface of the second mold insulating layer.

In some embodiments, the magnetic memory device may further include an upper interlayer insulating layer disposed on the second mold insulating layer and that covers the first magnetic tunnel junction pattern, and a third conductive pattern that penetrates the upper interlayer insulating layer, the second mold insulating layer, and the first mold insulating layer to be in contact with the first conductive pattern.

In some embodiments, a bottom end portion of the third conductive pattern may be inserted in the first conductive pattern.

In some embodiments, at least a portion of a top surface of the first conductive pattern may be in contact with the first mold insulating layer.

In some embodiments, the first and third conductive patterns may include metals that are different from each other, and the metal of the third conductive pattern may have a lower melting point and a lower resistivity than the metal of the first conductive pattern.

In some embodiments, the first conductive pattern may include tungsten, and the third conductive pattern may include copper.

In some embodiments, the second conductive pattern may include the same metal as the first conductive pattern.

In some embodiments, the magnetic memory device may further include a connection line pattern electrically connecting the first magnetic tunnel junction pattern to the third conductive pattern.

In some embodiments, the substrate may include a first selection transistor. The magnetic memory device may further include a second lower interlayer insulating layer between the substrate and the first lower interlayer insulating layer, and a first bit line disposed in the second lower interlayer insulating layer. The first conductive pattern may be electrically connected to the first selection transistor, and the second conductive pattern may be electrically connected to the first bit line.

In some embodiments, the magnetic memory device may further include a fourth conductive pattern that is spaced apart from the second conductive pattern and that penetrates the first and second mold insulating layers and the first lower interlayer insulating layer, a second magnetic tunnel junction pattern disposed on the second mold insulating layer and electrically connected to the fourth conductive pattern, and a second bit line disposed on and electrically connected to the second magnetic tunnel junction pattern.

In some embodiments, the substrate may further include a second selection transistor. The fourth conductive pattern may be electrically connected to the second selection transistor, and the first and second selection transistors may share one source line.

In an aspect, a magnetic memory device may comprise a substrate; a lower interlayer insulating layer on the substrate; at least one first conductive pattern disposed in lower interlayer insulating layer; a first mold insulating layer on the lower interlayer insulating layer in which the first mold insulating layer comprises a first thin-layer characteristic; a second mold insulating layer on the first mold insulating layer in which the second mold insulating layer comprises a second thin-layer characteristic that is different from the first thin-layer characteristic; at least one second conductive pattern that extends through the first mold insulating layer, the second mold insulating layer, the lower interlayer insulating layer to contact the substrate; a first magnetic tunnel junction pattern disposed on the second mold insulating layer in which the first magnetic tunnel junction pattern being electrically connected to the at least one second conductive pattern; an upper interlayer insulating layer on the second mold insulating layer; and at least one third conductive pattern that extends through the upper interlayer insulating layer, the second mold insulating layer and the first mold insulating layer to be electrically connected to the at least one first conductive pattern.

In some embodiments, a refractive index of the first mold insulating layer may be lower than a refractive index of the second mold insulating layer.

In some embodiments, each of the first mold layer and the second mold insulating layer may comprise a compressive stress, and a magnitude of the compressive stress of the first mold insulating layer may be less than a magnitude of the compressive stress of the second mold insulating layer.

In some embodiments, a density of the first mold insulating layer may be less than a density of the second mold insulating layer.

In some embodiments, the first mold insulating layer and the second mold insulating layer may comprise silicon oxide.

In some embodiments, the first mold insulating layer and the second mold insulating layer may comprise materials that are different from each other.

In some embodiments, a top surface of the at least one first conductive pattern may comprise a recessed region, and the at least one third conductive pattern may be in contact with the recessed region of the at least one first conductive pattern.

In some embodiments, the at least one first conductive pattern and the at least one third conductive pattern may comprise metals that are different from each other, and the metal of the at least one third conductive pattern may have a lower melting point and a lower resistivity than the metal of the at least one first conductive pattern.

In some embodiments, the first conductive pattern may comprise tungsten, and the third conductive pattern may comprise copper.

In some embodiments, the at least one second conductive pattern may comprise a same metal as the at least one first conductive pattern.

In an aspect, a method to form a magnetic memory device may comprise: forming a lower interlayer insulating layer on a substrate; forming at least one first conductive pattern in lower interlayer insulating layer; forming a first mold insulating layer on the lower interlayer insulating layer in which the first mold insulating layer comprises a first thin-layer characteristic; forming a second mold insulating layer on the first mold insulating layer in which the second mold insulating layer comprising a second thin-layer characteristic that is different from the first thin-layer characteristic; forming at least one second conductive pattern that extends through the first mold insulating layer, the second mold insulating layer, the lower interlayer insulating layer to contact the substrate; forming a first magnetic tunnel junction pattern disposed on the second mold insulating layer, the first magnetic tunnel junction pattern being electrically connected to the at least one second conductive pattern; forming an upper interlayer insulating layer on the second mold insulating layer; and forming at least one third conductive pattern that extends through the upper interlayer insulating layer, the second mold insulating layer and the first mold insulating layer to be electrically connected to the at least one first conductive pattern.

In some embodiments, a refractive index of the first mold insulating layer may be lower than a refractive index of the second mold insulating layer.

In some embodiments, each of the first mold insulating layer and the second mold insulating layer may comprise a compressive stress, and a magnitude of the compressive stress of the first mold insulating layer may be less than a magnitude of the compressive stress of the second mold insulating layer.

In some embodiments, a density of the first mold insulating layer may be less than a density of the second mold insulating layer.

In some embodiments, the first mold insulating layer and the second mold insulating layer may comprise silicon oxide.

In some embodiments, the first mold insulating layer and the second mold insulating layer may comprise materials that are different from each other.

In some embodiments, a top surface of the at least one first conductive pattern may comprise a recessed region, and the at least one third conductive pattern may be in contact with the recessed region of the at least one first conductive pattern.

In some embodiments, the at least one first conductive pattern and the at least one third conductive pattern may comprise metals that are different from each other, and the metal of the at least one third conductive pattern may have a lower melting point and a lower resistivity than the metal of the at least one first conductive pattern.

In some embodiments, the first conductive pattern may comprise tungsten, and the third conductive pattern may comprise copper.

In some embodiments, the at least one second conductive pattern may comprise a same metal as the at least one first conductive pattern.

In some embodiments, the first mold insulating layer may be formed by an atomic layer deposition (ALD) process, and the second mold insulating layer may be formed by a chemical vapor deposition (CVD) process.

In some embodiments, the ALD process that forms first mold insulating layer may be performed at about room temperature; and the CVD process that forms the second mold insulating layer may be performed in a temperature range from about 300° C. to about 500° C.

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1:
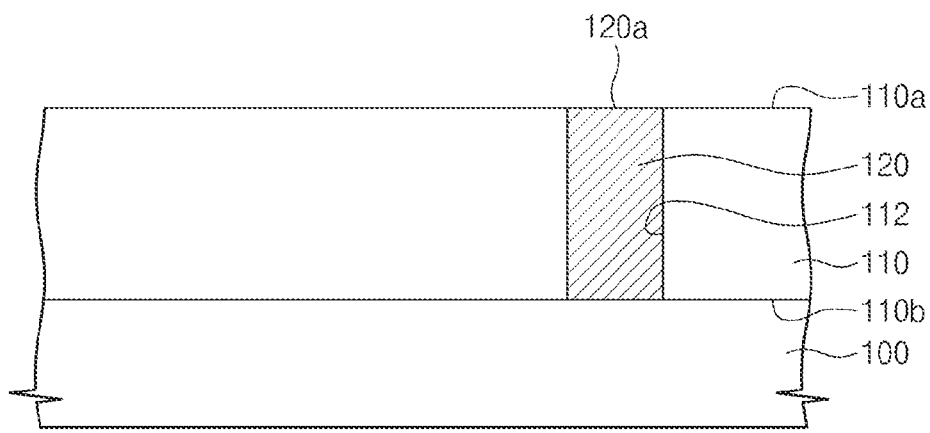
FIGS. 1 to 6 are cross-sectional views depicting stages of a method for manufacturing a magnetic memory device, according to some embodiments of the inventive concepts.

The inventive concepts will now be described more fully hereinafter with reference to the accompanying drawings, in which exemplary embodiments of the inventive concepts are shown. The inventive concepts and methods disclosed herein will be apparent from the following exemplary embodiments that will be described in more detail with reference to the accompanying drawings. The embodiments of the inventive concepts may, however, be embodied in different forms and should not be constructed as limited to the embodiments set forth herein. Rather, the embodiments that are provided herein are provided so that this disclosure will be thorough and complete, and will fully convey the scope of the inventive concept to those skilled in the art.

As used herein, the singular terms "a," "an" and "the" are intended to include the plural forms as well, unless the context clearly indicates otherwise. Similarly, plural forms of elements may also include singular forms of the element, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Similarly, it will be understood that when an element, such as a layer, region or substrate is referred to as being "on" another element, the element can be directly on the other element or intervening elements may be present. In contrast, the term "directly" means that there are no intervening elements. Additionally, the embodiment in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes.

Exemplary embodiments of aspects of the present inventive concepts explained and illustrated herein include their complementary counterparts. The same reference numerals or the same reference designators denote the same elements throughout the specification.

Figure 7A:
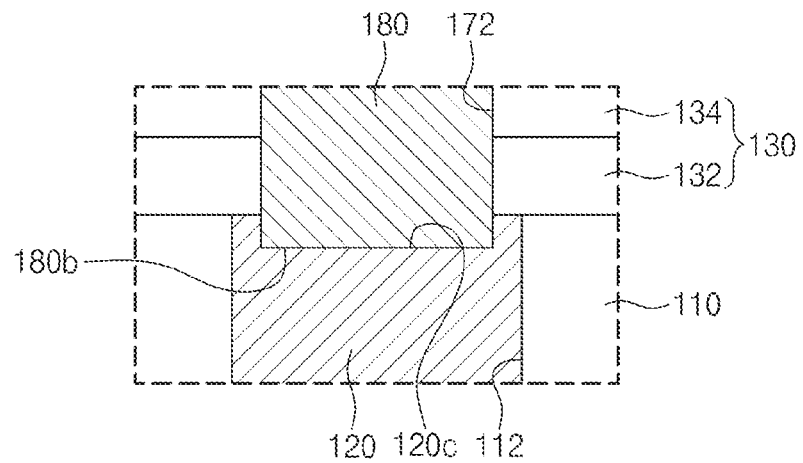
FIGS. 7A to 7C are enlarged views corresponding to a portion "A" of FIG. 6.
Figure 7B:
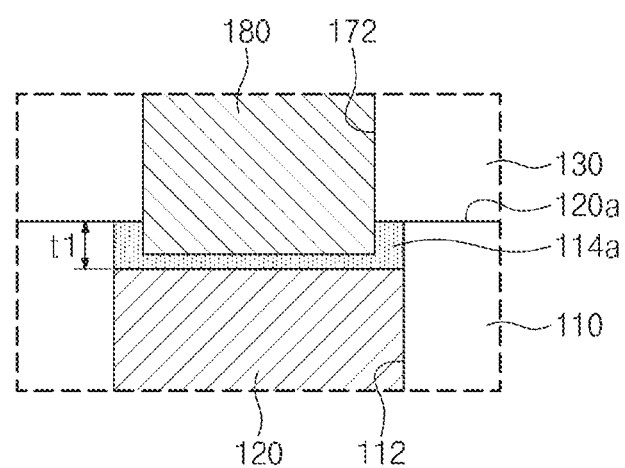
Figure 7C:
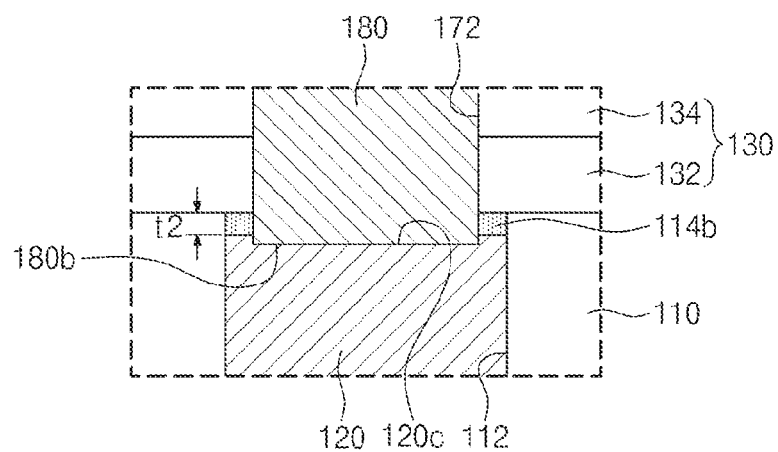
Figure 8:
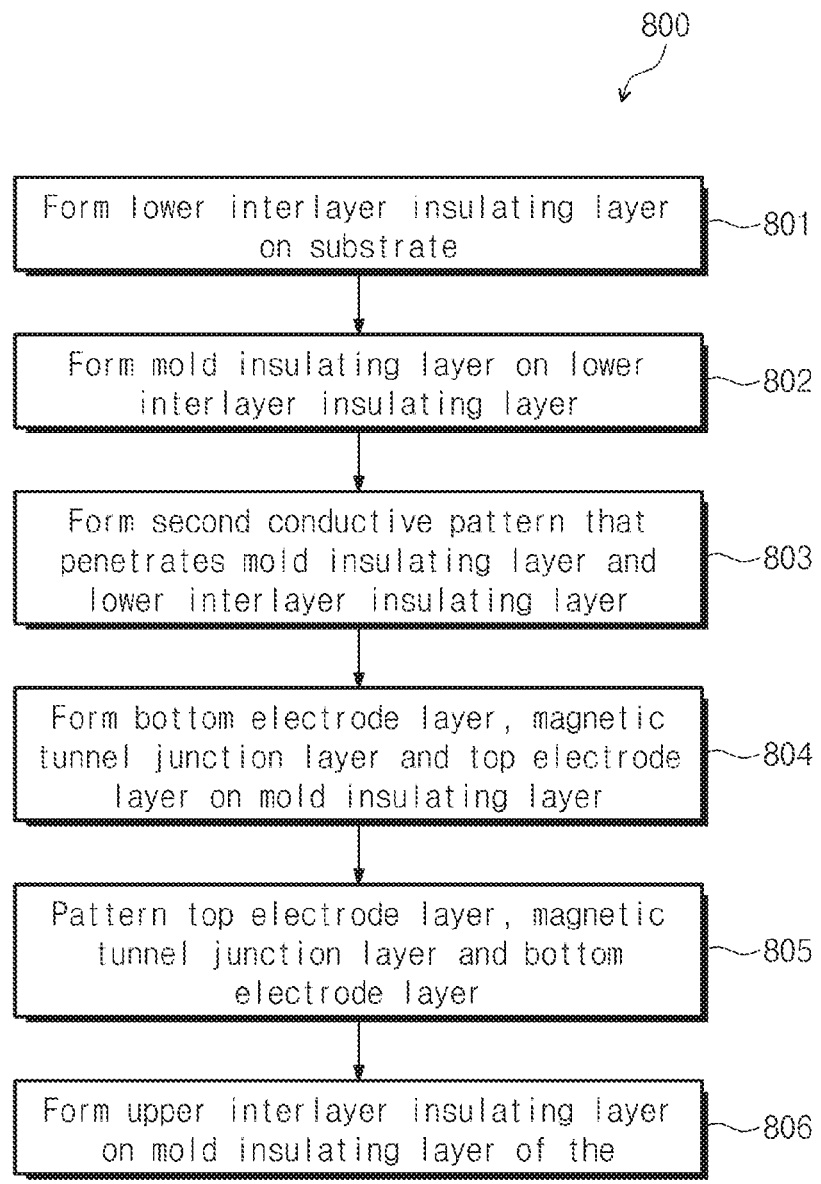
FIG. 8 is a flow diagram of a method of manufacturing a magnetic memory device corresponding to FIGS. 1 through 6 according to example embodiments of the inventive concepts.

FIGS. 1 to 6 are cross-sectional views depicting stages of a method for manufacturing a magnetic memory device according to some embodiments of the inventive concepts. FIGS. 7A to 7C are enlarged views corresponding to a portion "A" of FIG. 6. FIG. 8 is a flow diagram 800 of a method of manufacturing a magnetic memory device corresponding to FIGS. 1 through 6 according to example embodiments of the inventive concepts.

Referring to FIG. 1 and operation 801 in FIG. 8, a lower interlayer insulating layer 110 may be formed on a substrate 100. The substrate 100 may include a semiconductor substrate. For example, the substrate 100 may include a silicon substrate, a germanium substrate or a silicon-germanium substrate. In some embodiments, selection elements (not shown) may be formed on or in the substrate 100 before the lower interlayer insulating layer 110 is formed. The selection elements may include one or more diodes and/or one or more transistors. The lower interlayer insulating layer 110 may be formed from a single layer or from a multi-layer that includes at least one of silicon oxide, silicon nitride, silicon oxynitride, a low-k dielectric material or a combination thereof. The low-k dielectric material may include silicon oxy-hydrocarbon (SiOCH), porous-silicon oxy-hydrocarbon (p-SiOCH) or a combination thereof. The lower interlayer insulating layer 110 may be formed by a chemical vapor deposition (CVD) process.

A first conductive pattern 120 may be formed in the lower interlayer insulating layer 110. Forming the first conductive pattern 120 may include forming a first contact or via hole 112 that penetrates the lower interlayer insulating layer 110. A first conductive layer that fills the first contact hole 112 is then formed. The first conductive layer is planarized until a top surface of the lower interlayer insulating layer 110 is exposed. In the present embodiment depicted in FIG. 1, the first contact hole 112 may have an opened-hole shape that extends from a top surface 110a to a bottom surface 110b of the lower interlayer insulating layer 110. However, embodiments of the inventive concepts are not limited thereto. The first conductive pattern 120 may be electrically connected to the substrate 100. A top surface 120a of the first conductive pattern 120 may be disposed at the substantially same level as the top surface 110a of the lower interlayer insulating layer 110. In other words, the top surface 120a of the first conductive pattern 120 may be substantially coplanar with the top surface 110a of the lower interlayer insulating layer 110. The first conductive layer may include a metal, such as copper, aluminum, tungsten, titanium or a combination thereof. In some embodiments, the first conductive layer may include tungsten.

Figure 2:
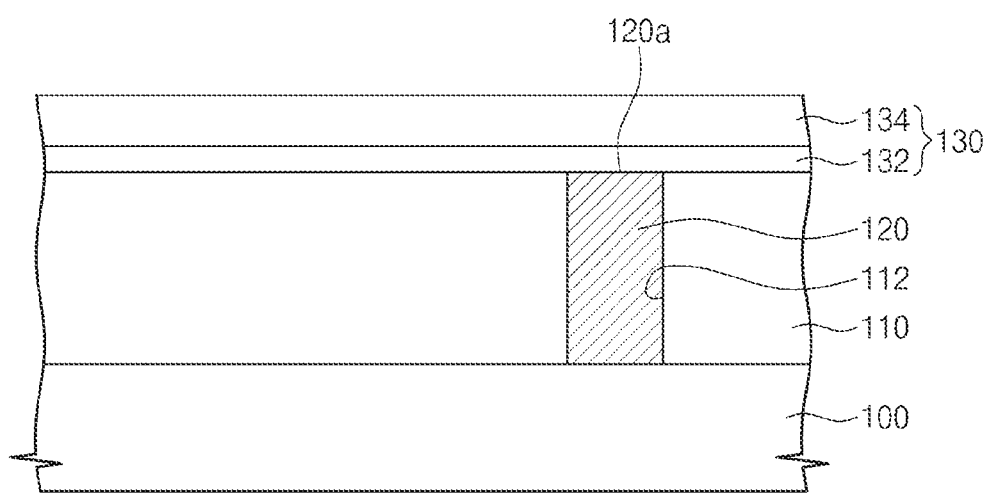

Referring to FIG. 2 and operation 802 in FIG. 8, a mold insulating layer 130 may be formed on the lower interlayer insulating layer 110. The mold insulating layer 130 may be formed from a double layer. In other words, the mold insulating layer 130 may include a first mold insulating layer 132 and a second mold insulating layer 134 that are sequentially stacked on the lower interlayer insulating layer 110. The first mold insulating layer 132 may be in contact with the lower interlayer insulating layer 110 and the first conductive pattern 120. According to some embodiments of the inventive concepts, the first mold insulating layer 132 and the second mold insulating layer 134 may be formed at different temperatures by different methods. For example, the first mold insulating layer 132 may be formed at a first temperature by an atomic layer deposition (ALD) process in which the first temperature may be about room temperature (e.g., in a range of about 15° C. to about 25° C.). The second mold insulating layer 134 may be formed by a CVD process at a second temperature that is greater than the first temperature. The second temperature may be in a range of, but not limited to, about 300° C. to about 500° C. The first mold insulating layer 132 has a thickness in a vertical direction that ranges from about 50 Å to about 100 Å. The second mold insulating layer 134 has a thickness in a vertical direction that ranges from about 500 Å to about 10,000 Å. The top surface 120 of the first conductive pattern 120 may be exposed during a process of forming the mold insulating layer 130, and thus an upper portion of the first conductive pattern 120 may be oxidized to form an oxide layer during the formation of the mold insulating layer 130. If the mold insulating layer 130 is formed at a high temperature, a thickness of the oxide layer may be accordingly increased. An increased thickness of the oxide layer may be a factor that increases a contact resistance between the first conductive pattern 120 and another conductive pattern (e.g., a third conductive pattern 180 of FIG. 6). However, according to some embodiments of the inventive concepts, the mold insulating layer 130 may be formed to be a double layer by two oxidizing processes, and a portion (i.e., the first mold insulating layer 132) of the mold insulating layer 130 that is in contact with the first conductive pattern 120 may be formed by an ALD process at about room temperature. Thus, it is possible to either prevent the upper portion of the first conductive pattern 120 from being oxidized at a high temperature or reduce the amount of the upper portion of the first conductor pattern 120 that is oxidized at a high temperature. As a result, the contact resistance between the first conductive pattern 120 and another conductive pattern (e.g., the third conductive pattern 180 of FIG. 6) may be reduced or minimized, thereby improving electrical characteristics of the magnetic memory device.

In some embodiments, the first mold insulating layer 132 and the second mold insulating layer 134 may be formed from the same material. In some embodiments, the first mold insulating layer 132 may include a silicon oxide layer formed by an ALD process at about room temperature, and the second mold insulating layer 134 may include a silicon oxide layer formed by a CVD process using an ozone ($O_3$)-based precursor. In the present embodiment, because the first and second mold insulating layers 132 and 134 are formed by the different processes (even though they include the same material), the first and second mold insulating layers 132 and 134 may have thin-layer characteristics that are different from each other. For example, a structure of the second mold insulating layer 134 may be denser than the structure of the first mold insulating layer 132. Accordingly, a refractive index of the second mold insulating layer 134 may be higher than a refractive index of the first mold insulating layer 132. Additionally, an etch rate of the second mold insulating layer 134 for one particular etchant may be lower than an etch rate of the first mold insulating layer 132 for the same etchant. Furthermore, the first and second mold insulating layers 132 and 134 may each have compressive stress, and a magnitude of the compressive stress of the first mold insulating layer 132 may be less than that of the compressive stress of the second mold insulating layer 134. As a result, because the mold insulating layer 130 includes the first and second mold insulating layers 132 and 134 that are sequentially stacked, the stress (i.e., the compressive stress) of the mold insulating layer 130 may be relatively relaxed as compared with a single-layered mold insulating layer (e.g., a mold insulating layer 130 formed from only the second mold insulating layer 134).

In some embodiments, the first mold insulating layer 132 and the second mold insulating layer 134 may be formed from materials that are different from each other. For example, the first mold insulating layer 132 may include a silicon nitride layer, and the second mold insulating layer 134 may include a silicon oxide layer. Thus, the first and second mold insulating layers 132 and 134 of these embodiments may have thin-layer characteristics that are different from each other.

Figure 3:
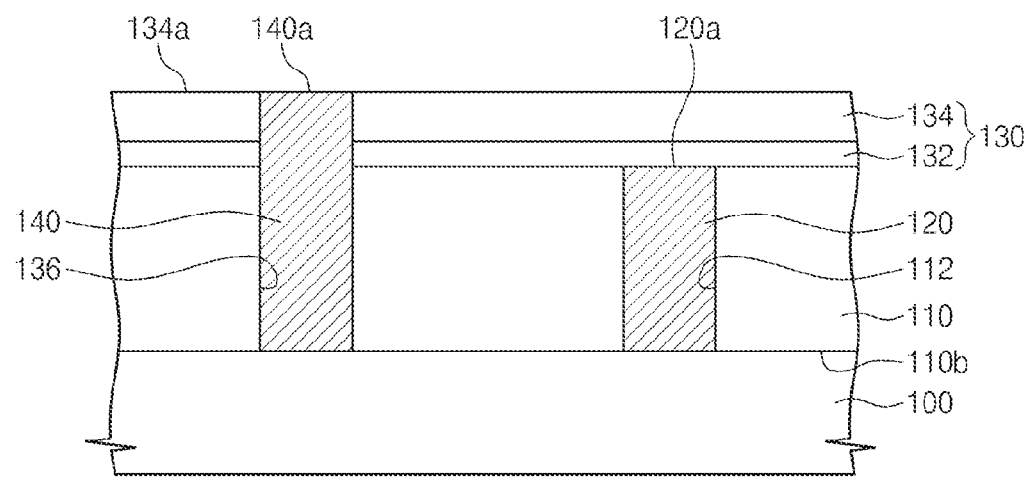

Referring to FIG. 3 and operation 803 in FIG. 8, a second conductive pattern 140 may be formed to penetrate the mold insulating layer 130 and the lower interlayer insulating layer 110. Forming the second conductive pattern 140 may include forming a second contact or via hole 136 that penetrates the second and first mold insulating layers 134 and 132 and extends into the lower interlayer insulating layer 110. A second conductive layer that fills the second contact hole 136 is formed. The second conductive layer is planarized until a top surface 134a of the second mold insulating layer 134 is exposed. In the present embodiment, the second contact hole 136 may have an opened-hole shape that extends from the top surface 134a of the second mold insulating layer 134 to the bottom surface 110b of the lower interlayer insulating layer 110. However, embodiments of the inventive concepts are not limited thereto. A top surface 140a of the second conductive pattern 140 may be disposed at substantially the same level as the top surface 134a of the second mold insulating layer 134. In other words, the top surface 140a of the second conductive pattern 140 may be higher than the top surface 120a of the first conductive pattern 120. The mold insulating layer 130 may be used to form the second conductive pattern 140 in which the top surface 140a is higher than the top surface 120a of the first conductive pattern 120. In some embodiments, the second conductive layer may include the same material as the first conductive layer. For example, the second conductive layer may include a metal, such as copper, aluminum, tungsten, titanium or a combination thereof. In some embodiments, the second conductive layer may include tungsten.

Figure 4:
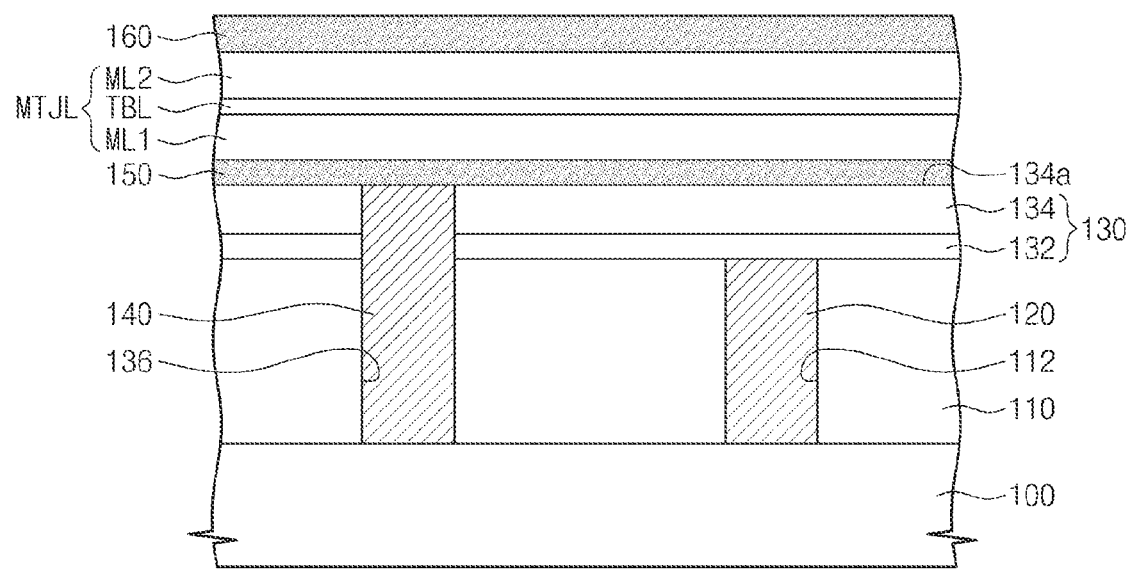

Referring to FIG. 4 and operation 804 in FIG. 8, a bottom electrode layer 150, a magnetic tunnel junction layer MTJL, and a top electrode layer 160 may be sequentially formed on the mold insulating layer 130.

The bottom electrode layer 150 may include at least one of a conductive metal nitride (e.g., titanium nitride or tantalum nitride), a transition metal (e.g., titanium or tantalum) or a rare-earth metal (e.g., ruthenium or platinum). The bottom electrode layer 150 may be in electrical contact with the second conductive pattern 140. The bottom electrode layer 150 may be formed by a physical vapor deposition (PVD) process or a CVD process.

The magnetic tunnel junction layer MTJL may include a first magnetic layer ML1, a tunnel barrier layer TBL, and a second magnetic layer ML2 that are sequentially stacked. One of the first and second magnetic layers ML1 and ML2 may correspond to a reference layer that has a magnetization direction that is fixed in one direction, and the other of the first and second magnetic layers ML1 and ML2 may correspond to a free magnetic layer that has a magnetization direction that is changeable to be parallel or anti-parallel to the fixed magnetization direction of the reference layer. In one embodiment, the first and second magnetic layers ML1 and ML2 may have a horizontal anisotropy, that is, a magnetization direction that is substantially parallel to the top surface 134a of the second mold insulating layer 134. In another embodiment, the first and second magnetic layers ML1 and ML2 may have a vertical anisotropy, that is, a magnetization direction that is substantially perpendicular to the top surface 134a of the second mold insulating layer 134. In yet another embodiment, the first and second magnetic layers ML1 and ML2 may have a magnetization direction that is between a horizontal magnetization direction and a vertical magnetization direction. The magnetic tunnel junction layer MTJL will be described later in more detail with reference to FIGS. 9A and 9B. Each of the first magnetic layer ML1, the tunnel barrier layer TBL and the second magnetic layer ML2 may be formed by a PVD process or a CVD process.

The top electrode layer 160 may include at least one of tungsten, tantalum, aluminum, copper, gold, silver, titanium a metal nitride (e.g., titanium nitride or tantalum nitride) or a combination thereof. The top electrode layer 160 may be formed by a PVD process or a CVD process.

Figure 5:
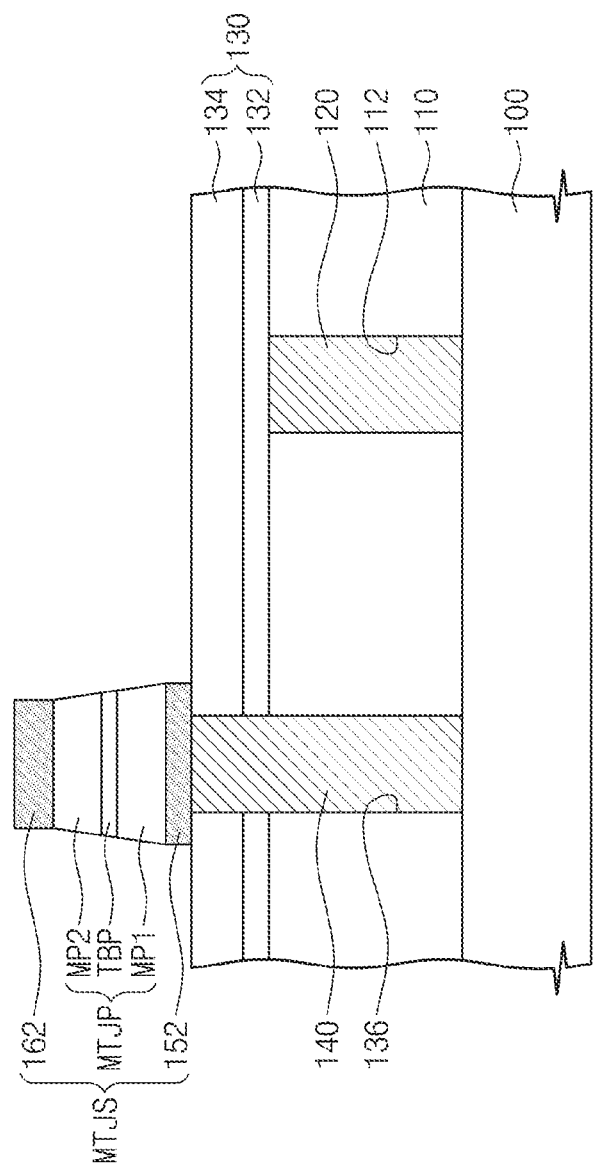

Referring to FIG. 5 and operation 806 in FIG. 8, the top electrode layer 160, the magnetic tunnel junction layer MTJL, and the bottom electrode layer 150 may be patterned to form a top electrode 162, a magnetic tunnel junction pattern MTJP, and a bottom electrode 152. Patterning the top electrode layer 160, the magnetic tunnel junction layer MTJL, and the bottom electrode layer 150 may include forming a mask pattern (not shown) on the top electrode layer 160, and performing an etching process using the mask pattern as an etch mask. In some embodiments, the etching process may include an anisotropic etching process, such as a reactive ion etching (RIE) process or a sputtering etching process. In certain embodiments, the etching process may include an ion beam etching process. The etching process may be performed a plurality of times. That is, the top electrode layer 160, the magnetic tunnel junction layer MTJL, and the bottom electrode layer 150 may be sequentially etched by the etching processes performed the plurality of times. The bottom electrode 152, the magnetic tunnel junction pattern MTJP, and the top electrode 162 may form a magnetic tunnel junction structure MTJS.

The magnetic tunnel junction structure MTJS may be formed on the second conductive pattern 140. In a plan view, the magnetic tunnel junction structure MTJS may be spaced apart from the first conductive pattern 120 and at least a portion of the magnetic tunnel junction structure MTJS may overlap the second conductive pattern 140. In other words, the magnetic tunnel junction structure MTJS may be electrically connected to the second conductive pattern 140. In this embodiment, the magnetic tunnel junction pattern MTJP may include a first magnetic pattern MP1, a tunnel barrier pattern TBP, and a second magnetic pattern MP2 that are sequentially stacked. The magnetic tunnel junction pattern MTJP will be described later in more detail with reference to FIGS. 9A and 9B.

Figure 6:
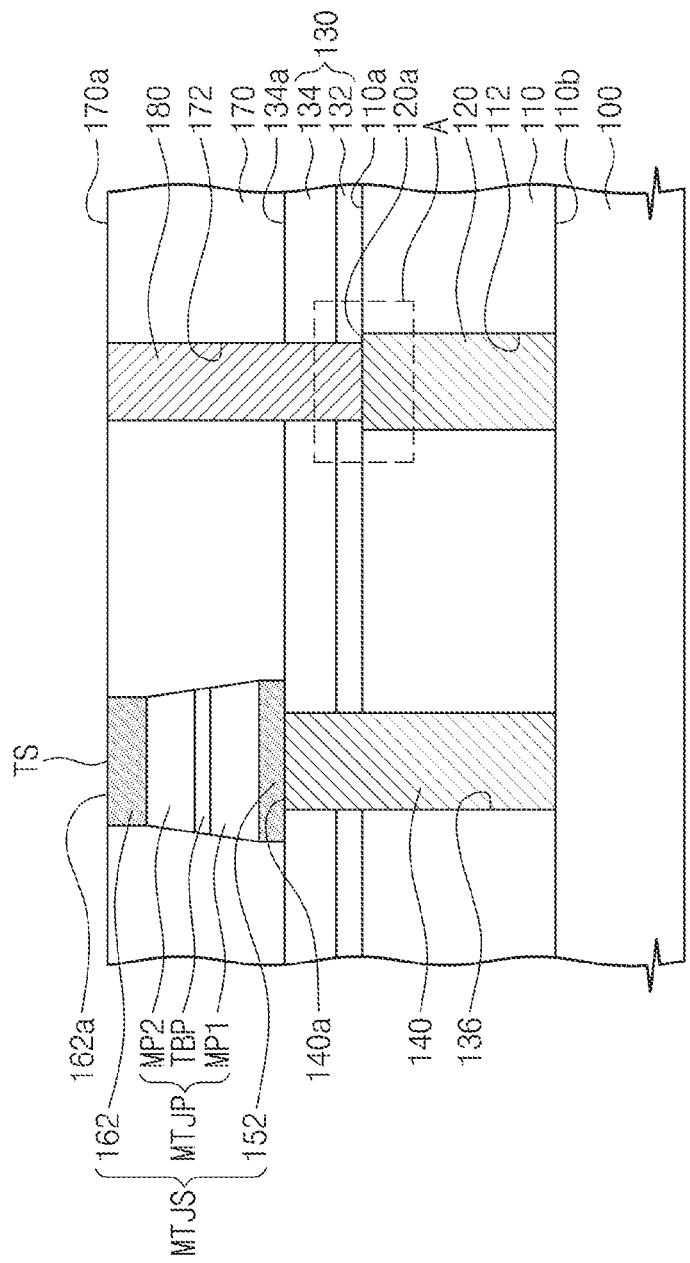

Referring to FIG. 6 and operation 806 in FIG. 8, an upper interlayer insulating layer 170 may be formed on the second mold insulating layer 134. The upper interlayer insulating layer 170 may cover a sidewall of the magnetic tunnel junction structure MTJS, but may expose a top surface TS of the magnetic tunnel junction structure MTJS. The upper interlayer insulating layer 170 may include at least one of silicon oxide, silicon nitride, silicon oxynitride, a low-k dielectric material (e.g., silicon oxy-hydrocarbon (SiOCH) or porous-silicon oxy-hydrocarbon (p-SiOCH)) or a combination thereof. The upper interlayer insulating layer 170 may be formed by a CVD process. In the present embodiment, a top surface of the upper interlayer insulating layer 170 may be substantially coplanar with a top surface 162a of the top electrode 162. However, embodiments of the inventive concepts are not limited thereto. In certain embodiments, the upper interlayer insulating layer 170 may cover the top surface 162a of the top electrode 162.

A third conductive pattern 180 may be formed to penetrate the upper interlayer insulating layer 170 and the mold insulating layer 130. The third conductive pattern 180 may be connected to the first conductive pattern 120. Forming the third conductive pattern 180 may include forming a third contact or via hole 172 that penetrates the upper interlayer insulating layer 170, the second mold insulating layer 134, and the first mold insulating layer 132 to expose the first conductive pattern 120. A third conductive layer is formed that fills the third contact hole 172, and the third conductive layer is planarized until the top surface 170a of the upper interlayer insulating layer 170 is exposed. A mask pattern (not shown) may be formed on the upper interlayer insulating layer 170, and an anisotropic etching process may be performed using the mask pattern (not shown) as an etch mask to form the third contact hole 172. In some embodiments, at least a portion of the top surface 120a of the first conductive pattern 120 may be recessed by a predetermined depth caused by over-etching of the anisotropic etching process that is used to form the third contact hole 172. In other words, as illustrated in FIG. 7A, a bottom end portion 180b of the third conductive pattern 180 may be inserted in the recessed region 120c of the top surface of the first conductive pattern 120.

In the process of forming mold insulating layer 130 that is described with reference to FIG. 2, if the mold insulating layer 130 is formed by only a single layer (i.e., the second mold insulating layer 134) at a high temperature, a thick oxide layer 114a may be formed locally on the top surface 120a of the first conductive pattern 120, as depicted in FIG. 7B. In this case, the third contact hole 172 may not completely penetrate the thick oxide layer 114a of the first conductive pattern 120 in a process-margin range of the process of forming the third contact hole 172. Thus, at least a portion of the thick oxide layer 114a may remain between the third conductive pattern 180 and the first conductive pattern 120 that increases a contact resistance between the first and third conductive patterns 120 and 180. However, according to some embodiments of the inventive concepts, because the first mold insulating layer 132 is formed using the ALD process that is performed at about room temperature, as described with reference to FIG. 2, an oxide layer may not be formed on the top surface of the first conductive pattern 120. Thus, the third conductive pattern 180 may be in direct contact with the first conductive pattern 120. Even though an oxide layer 114b is formed locally on the top surface of the first conductive pattern 120 by natural oxidation or the process of forming the first mold insulating layer 132, as depicted in FIG. 7C, a thickness t2 of the oxide layer 114b may be less than a thickness t1 of the oxide layer 114a of FIG. 7B (i.e., t2<t1). Thus, the third contact hole 172 may completely penetrate the oxide layer 114b of the first conductive pattern 120 in the process-margin range of the process of forming the third contact hole 172. That is, the third contact hole 172 may expose the first conductive pattern 120. As a result, the bottom end portion 180b of the third conductive pattern 180 may be inserted in the recessed region 120c of the top surface of the first conductive pattern 120, and thus the third conductive pattern 180 may be in direct contact with the first conductive pattern 120. In other words, according to some embodiments of the inventive concepts, the contact resistance between the first and third conductive patterns 120 and 180 may be reduced or minimized in the process-margin range of the process of forming the third contact hole 172.

The third conductive layer may include a metal such as copper, aluminum, tungsten, or titanium, or a combination thereof. In some embodiments, the third conductive layer may include a material that is different from the first conductive layer. For example, the third conductive layer may include copper, and the first conductive layer may include tungsten. Thus, a melting point and a resistivity of the third conductive layer may be lower than the melting point and resistance of the first conductive layer. In other words, the melting point and the resistivity of the first conductive layer may be higher than the melting point and resistance of the third conductive layer. This aspect may be used advantageously in view of limitations of the manufacturing processes (e.g., a different in-process-critical temperature between before and after the formation of the magnetic tunnel junction structure or a difference in gap-fill ability between the first and third conductive layers). Electrical characteristics of the magnetic memory device may deteriorated by the relatively high resistivity of the first conductive layer. Thus, it may be necessary to reduce or minimize the contact resistance between the first and third conductive patterns 120 and 180 in order to improve the electrical characteristics of the magnetic memory device. As described above, the embodiments of the inventive concepts may provide advantages that satisfy potential limitations of the manufacturing processes.

The magnetic memory device manufactured according to some embodiments of the inventive concepts will be described again with reference to FIGS. 6 and 7A.

Referring again to FIG. 6, the lower interlayer insulating layer 110 may be disposed on the substrate 100. The substrate 100 may include selection elements (not shown), such as one or more diodes and/or one or more transistors. The lower interlayer insulating layer 110 may include at least one of silicon oxide, silicon nitride, silicon oxynitride, a low-k dielectric material or a combination thereof. The lower interlayer insulating layer 110 may be single-layered or multi-layered.

The mold insulating layer 130 may be disposed on the lower interlayer insulating layer 110. The mold insulating layer 130 may include the first mold insulating layer 132 and the second mold insulating layer 134 that are sequentially stacked on the insulating layer 110. The first mold insulating layer 132 may include an insulating layer formed by an ALD process performed at about room temperature. The second mold insulating layer may include an insulating layer formed by the CVD process performed at a temperature that is greater than room temperature. In some embodiments, the first mold insulating layer 132 and the second mold insulating layer 134 may include the same material. For example, each of the first and second mold insulating layers 132 and 134 may include a silicon oxide layer, and the first and second mold insulating layers 132 and 134 may have thin-layer characteristics that are different from each other. For example, the second mold insulating layer 134 may be denser than the first mold insulating layer 132. Accordingly, the refractive index of the second mold insulating layer 134 may be higher than the refractive index of the first mold insulating layer 132. Additionally, the etch rate of the second mold insulating layer 134 by one particular etchant may be lower than the etch rate of the first mold insulating layer 132 by the same etchant. Furthermore, the first and second mold insulating layers 132 and 134 may have the compressive stress, and the magnitude of the compressive stress of the first mold insulating layer 132 may be less than the compressive stress of the second mold insulating layer 134. As a result, the stress of the mold insulating layer 130 formed by the first and second mold insulating layers 132 and 134 may be relatively relaxed as compared with a single-layered mold insulating layer (e.g., a mold insulating layer formed of, for example, only the second mold insulating layer 134).

In certain embodiments, the first mold insulating layer 132 and the second mold insulating layer 134 may include materials that are different from each other. For example, the first mold insulating layer 132 may include a silicon nitride layer, and the second mold insulating layer 134 may include a silicon oxide layer. Thus, the first and second mold insulating layers 132 and 134 may have thin-layer characteristics that are different from each other.

The first conductive pattern 120 and the second conductive pattern 140 having different heights may be disposed on the substrate 100. The first conductive pattern 120 may be provided in the first contact or via hole 112 that penetrates the lower interlayer insulating layer 110. The first contact hole 112 may have, but is not limited to, an opened-hole shape that extends from the top surface 110a to the bottom surface 110b of the lower interlayer insulating layer 110. The top surface 120a of the first conductive pattern 120 may be substantially coplanar with the top surface 110a of the lower interlayer insulating layer 110. A portion of the top surface 120a of the first conductive pattern 120 may be in contact with the first mold insulating layer 132.

The second conductive pattern 140 may be provided in the second contact or via hole 136 that penetrates the mold insulating layer 130 and the lower interlayer insulating layer 110. The second contact hole 136 may be spaced apart from the first contact hole 112. The second contact hole 136 may have, but is not limited to, an opened-hole shape that penetrates the mold insulating layer 130 and the lower interlayer insulating layer 110 to expose the substrate 100. The top surface 140a of the second conductive pattern 140 may be disposed at the substantially same level as the top surface 134a of the second mold insulating layer 134. In other words, the top surface 140a of the second conductive pattern 140 may be higher than the top surface 120a of the first conductive pattern 120. Each of the first and second conductive patterns 120 and 140 may include a metal, such as copper, aluminum, tungsten, titanium or a combination thereof. In some embodiments, each of the first and second conductive patterns 120 and 140 may include tungsten.

The magnetic tunnel junction structure MTJS may be disposed on and be in electrical contact with the second conductive pattern 140. In a plan view, the magnetic tunnel junction structure MTJS may be spaced apart from the first conductive pattern 120 and at least a portion of the magnetic tunnel junction structure MTJS may overlap the second conductive pattern 140. In other words, the magnetic tunnel junction structure MTJS may be electrically connected to the second conductive pattern 140. The magnetic tunnel junction structure MTJS may include the bottom electrode 152, the magnetic tunnel junction pattern MTJP, and the top electrode 162 that are sequentially stacked on the second conducive pattern 140. The bottom electrode 152 may include at least one of a conductive metal nitride (e.g., titanium nitride or tantalum nitride), a transition metal (e.g., titanium or tantalum) or a rare-earth metal (e.g., ruthenium or platinum). The bottom electrode 152 may be in electrical contact with the second conductive pattern 140. The top electrode 162 may include at least one of tungsten, tantalum, aluminum, copper, gold, silver, titanium, or a metal nitride (e.g., titanium nitride or tantalum nitride) or a combination thereof.

The magnetic tunnel junction pattern MTJP may include the first magnetic pattern MP1, the tunnel barrier pattern TBP, and the second magnetic pattern MP2 that are sequentially stacked. Embodiments of the magnetic tunnel junction pattern MTJP will be described in detail with reference to FIGS. 9A and 9B.

Figure 9A:
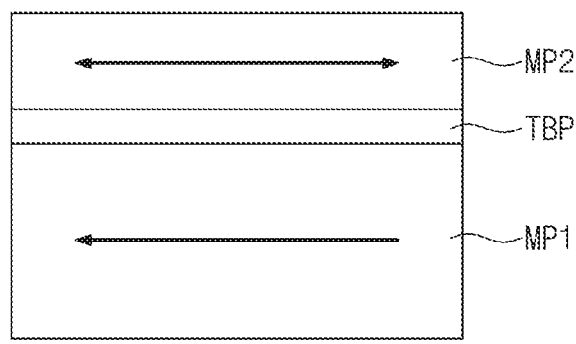
FIGS. 9A and 9B are conceptual diagrams depicting magnetic tunnel junction patterns according to some embodiments of the inventive concepts.
Figure 9B:
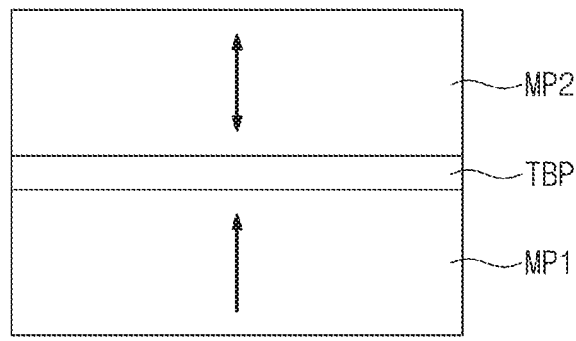

FIGS. 9A and 9B are conceptual diagrams depicting magnetic tunnel junction patterns according to some embodiments of the inventive concepts.

The magnetic tunnel junction pattern MTJP may include the first magnetic pattern MP1, the tunnel barrier pattern TBP and the second magnetic pattern MP2. One of the first and second magnetic patterns MP1 and MP2 may correspond to a free magnetic pattern of a magnetic tunnel junction, and the other of the first and second magnetic patterns MP1 and MP2 may correspond to a pinned or fixed magnetic pattern (i.e., a reference pattern) of the magnetic tunnel junction. For the purpose of ease and convenience in explanation, the first magnetic pattern MP1 will be described as the pinned magnetic pattern and the second magnetic pattern MP2 will be described as the free magnetic pattern. However, in some embodiments, the first magnetic pattern MP1 may be the free magnetic pattern and the second magnetic pattern MP2 may be the pinned magnetic pattern. A value of electrical resistance of the magnetic tunnel junction pattern MTJP may be determined based on the magnetization directions of the free magnetic pattern and the pinned magnetic pattern. For example, the value of electrical resistance of the magnetic tunnel junction pattern MTJP if the magnetization directions of the free and pinned magnetic patterns are anti-parallel to each other may be much greater than the value of electrical resistance of the magnetic tunnel junction pattern MTJP if the magnetization directions of the free and pinned patterns are parallel to each other. As a result, the value of electrical resistance of the magnetic tunnel junction pattern MTJP may be adjusted by changing the magnetization direction of the free magnetic pattern. Changing the magnetization direction of the free magnetic patterns may be used as a data-storing principle of the magnetic memory device according to some embodiments of the inventive concepts.

Referring to FIG. 9A, the magnetization directions of the first and second magnetic patterns MP1 and MP2 may be substantially parallel to a top surface of the tunnel barrier pattern TBP, and thus the first and second magnetic patterns MP1 and MP2 may form a horizontal magnetization structure. That is, the first and second magnetic patterns MP1 and MP2 may have a horizontal magnetization anisotropy. In this case, the first magnetic pattern MP1 may include a layer including an anti-ferromagnetic material and a layer including a ferromagnetic material. In some embodiments, the layer including the anti-ferromagnetic material may include at least one of PtMn, IrMn, MnO, MnS, MnTe, $MnF_2$, $FeCl_2$, FeO, $CoCl_2$, CoO, $NiCl_2$, NiO or Cr. In some embodiments, the layer of the first magnetic pattern MP1 that includes the anti-ferromagnetic material may include at least one precious metal. The precious metal may include ruthenium (Ru), rhodium (Rh), palladium (Pd), osmium (Os), iridium (Ir), platinum (Pt), gold (Au) or silver (Ag). The layer of the first magnetic pattern MP1 that includes the ferromagnetic material may include at least one of CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO or $Y_3Fe_5O_{12}$.

The second magnetic pattern MP2 may include a material that has a changeable magnetization direction. The second magnetic pattern MP2 may include a ferromagnetic material. For example, the second magnetic pattern MP2 may include at least one of FeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO or $Y_3Fe_5O_{12}$.

The second magnetic pattern MP2 may include a plurality of layers. For example, the second magnetic pattern MP2 may include a plurality of ferromagnetic layers and a non-magnetic material layer that are disposed between the ferromagnetic layers. In this case, the ferromagnetic layers and the non-magnetic material layer may form a synthetic antiferromagnetic layer. The synthetic antiferromagnetic may reduce a critical current density of the magnetic memory device and may also improve thermal stability of the magnetic memory device.

The tunnel barrier pattern TBP may include at least one of magnetic oxide (MgO), titanium oxide (TiO), aluminum oxide (AlO), magnesium-zinc oxide (MgZnO), magnesium-boron oxide (MgBO), titanium nitride (TiN) or vanadium nitride (VN). In some embodiments, the tunnel barrier pattern TBP may be a single layer formed of magnesium oxide (MgO). Alternatively, the tunnel barrier pattern TBP may include a plurality of layers. The tunnel barrier pattern TBP may be formed using a CVD process.

Referring to FIG. 9B, the magnetization directions of the first and second magnetic patterns MP1 and MP2 may be substantially perpendicular to the top surface of the tunnel barrier pattern TBP, and thus the first and second magnetic patterns MP1 and MP2 may form a perpendicular magnetization structure. That is, the first and second magnetic patterns MP1 and MP2 may have a vertical magnetization anisotropy. In this case, each of the first and second magnetic patterns MP1 and MP2 may include at least one of a material having a $L1_0$ crystal structure, a material having a hexagonal close packed (HCP) crystal structure or an amorphous rare-earth transition metal (RE-TM) alloy. In some embodiments, each of the first and second magnetic patterns MP1 and MP2 may include at least one of $Fe_{50}Pt_{50}$ having a $L1_0$ crystal structure, $Fe_{50}Pd_{50}$ having a $L1_0$ crystal structure, $Co_{50}Pt_{50}$ having a $L1_0$ crystal structure, $Co_{50}Pd_{50}$ having a $L1_0$ crystal structure or $Fe_{50}Ni_{50}$ having a $L1_0$ crystal structure. In some embodiments, each of the first and second magnetic patterns MP1 and MP2 may include a CoPt disordered alloy or a $Co_3Pt$ ordered alloy that has a HCP crystal structure and a platinum content of about 10 at % to about 45 at %. In some embodiments, each of the first and second magnetic patterns MP1 and MP2 may include at least one amorphous RE-TM alloy that includes at least one element selected from iron (Fe), cobalt (Co), and nickel (Ni) and at least one element selected from terbium (Tb), dysprosium (Dy), and gadolinium (Gd) corresponding to rare-earth metals.

The first and second magnetic patterns MP1 and MP2 may include a material having interface perpendicular magnetic anisotropy (i-PMA). The interface perpendicular magnetic anisotropy may provide that a magnetic layer having an intrinsic horizontal magnetization property has a perpendicular magnetization direction caused by an influence of an interface between the magnetic layer and another that is adjacent layer magnetic layer. Here, the intrinsic horizontal magnetization property may provide that a magnetic layer that has a magnetization direction that is substantially parallel to the widest surface of the magnetic layer if an external factor does not exist. For example, if the magnetic layer having the intrinsic horizontal magnetization property is formed on a substrate and an external factor does not exist, the magnetization direction of the magnetic layer may be substantially parallel to a top surface of the substrate.

Each of the first and second magnetic patterns MP1 and MP2 may, for example, include at least one of cobalt (Co), iron (Fe) or nickel (Ni). Additionally, each of the first and second magnetic patterns MP1 and MP2 may further include at least one element selected from non-magnetic materials that include boron (B), zinc (Zn), aluminum (Al), titanium (Ti), ruthenium (Ru), tantalum (Ta), silicon (Si), silver (Ag), gold (Au), copper (Cu), carbon (C) and nitrogen (N). For example, each of the first and second magnetic patterns MP1 and MP2 may include CoFe or NiFe, and may further include boron (B). Moreover, to reduce saturation magnetization of the first and second magnetic patterns MP1 and MP2, each of the first and second magnetic patterns MP1 and MP2 may further include at least one of titanium (Ti), aluminum (Al), silicon (Si), magnesium (Mg) or tantalum (Ta).

The magnetic tunnel junction layer MTJL described with reference to FIG. 4 may include substantially the same material as the magnetic tunnel junction pattern MTJP.

Referring again to FIG. 6, the upper interlayer insulating layer 170 may be formed on the mold insulating layer 130. The upper interlayer insulating layer 170 may cover the sidewall of the magnetic tunnel junction structure MTJS, but may expose the top surface TS of the magnetic tunnel junction structure MTJS. The upper interlayer insulating layer 170 may include at least one of silicon oxide, silicon nitride, silicon oxynitride a low-k dielectric material (e.g., silicon oxy-hydrocarbon (SiOCH) or porous-silicon oxy-hydrocarbon (p-SiOCH)) or a combination thereof. In the present embodiment, the top surface 170a of the upper interlayer insulating layer 170 may be substantially coplanar with the top surface 162a of the top electrode 162. However, embodiments of the inventive concepts are not limited thereto. In some embodiments, the upper interlayer insulating layer 170 may cover the top surface 162a of the top electrode 162.

The third conductive pattern 180 may penetrate the upper interlayer insulating layer 170 and the mold insulating layer 130 and to be electrically connected to the first conductive pattern 120. The third conductive pattern 180 may be provided in the third contact or via hole 172 that penetrates the upper interlayer insulating layer 170, the second mold insulating layer 134 and the first mold insulating layer 132 to expose the first conductive pattern 120. In some embodiments, as depicted in FIG. 7a, the third contact hole 172 may extend into the first contact hole 112. In other words, a bottom end portion 180b (FIG. 7A) of the third conductive pattern 180 may be inserted in the first conductive pattern 120. The third conductive pattern 180 may be in direct contact with the first conductive pattern 120. The third conductive pattern 180 may include a metal such as copper, aluminum, tungsten, titanium or a combination thereof. In some embodiments, the third conductive pattern 180 may include a material that is different from the first conductive pattern 120. For example, the third conductive pattern 180 may include copper, and the first conductive pattern 120 may include tungsten.

Figure 10:
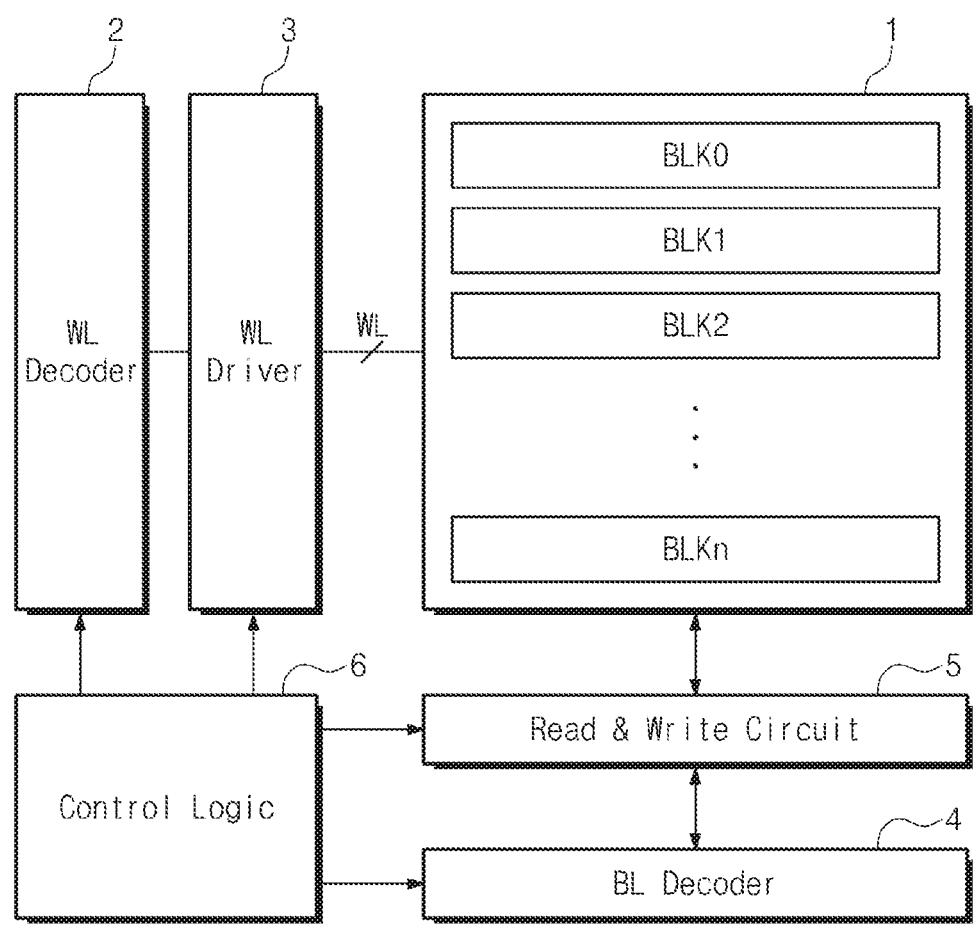
FIG. 10 is a schematic block diagram depicting a magnetic memory device according to some embodiments of the inventive concepts.

FIG. 10 is a schematic block diagram depicting a magnetic memory device according to some embodiments of the inventive concepts.

Referring to FIG. 10, a magnetic memory device may include a memory cell array 1, a word line decoder 2, a word line driver 3, a bit line decoder 4, a read and write circuit 5, and a control logic circuit 6.

The memory cell array 1 may include a plurality of memory blocks BLK0 to BLKn. Each of the memory blocks BLK0 to BLKn may include a plurality of memory cells, a plurality of word lines, a plurality of bit lines and a plurality of source lines. The word lines, the bit lines and the source lines may be electrically connected to the memory cells.

The word line decoder 2 may decode an address signal that is input from an external system (not shown) to select one of the word lines. The address signal decoded in the word line decoder 2 may be provided to the word line driver 3. The word line driver 3 may respectively provide a selected word line voltage and unselected word line voltages that are generated from a voltage generation circuit (not shown) to the selected word line and unselected word lines in response to a control signal of the control logic circuit 6. The word line decoder 2 and the word line driver 3 may be connected in common to the plurality of memory blocks BLK0 to BLKn, and may provide driving signals to the word lines of one memory block selected by a block selection signal.

The bit line decoder 4 may decode an address signal that is input from the external system to select one of the bit lines. The bit line decoder 4 may be connected in common to the plurality of memory blocks BLK0 to BLKn, and may provide data to the bit lines of the memory block selected by the block selection signal.

The read and write circuit 5 may be connected to the memory cell array 1 through the bit lines. The read and write circuit 5 may select one of the bit lines in response to a bit line selection signal received from the bit line decoder 4. The read and write circuit 5 may be configured to exchange data with the external system. The read and write circuit 5 may be operated in response to a control signal of the control logic circuit 6. The read and write circuit 5 may receive power (e.g., a voltage or current) from the control logic circuit 6 and may provide the power to the selected bit line.

The control logic circuit 6 may control overall operations of the magnetic memory device. The control logic circuit 6 may receive control signals (not shown) and an external voltage (not shown), and may be operated in response to the received control signals. The control logic circuit 6 may generate power that is necessary for internal operations by way of the external voltage. The control logic circuit 6 may control a read operation, a write operation and/or an erase operation in response to the control signals.

Figure 11:
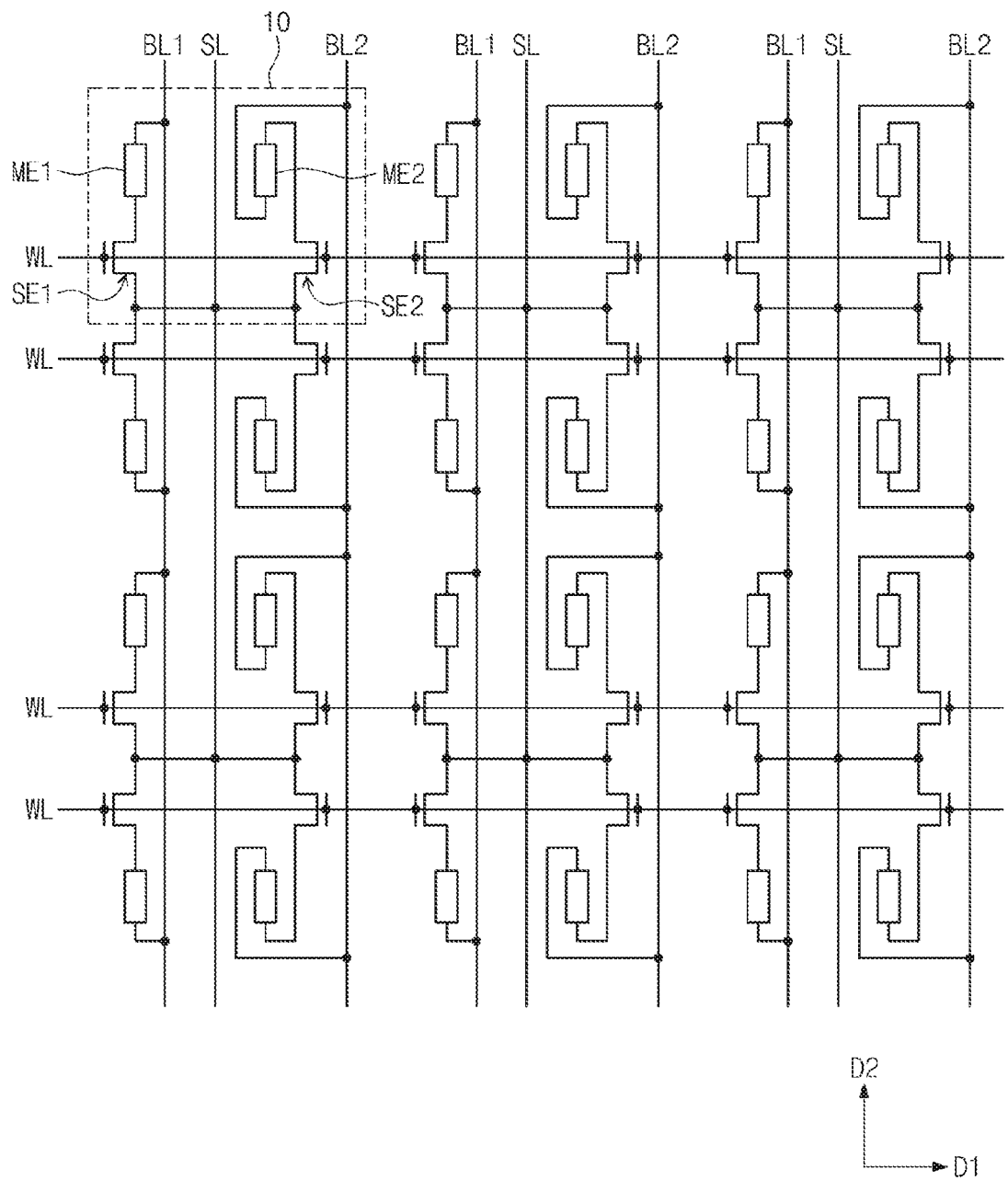
FIG. 11 is a circuit diagram depicting a memory cell array of a magnetic memory device according to some embodiments of the inventive concepts.

FIG. 11 is a circuit diagram depicting a memory cell array of a magnetic memory device according to some embodiments of the inventive concepts. That is, FIG. 11 is a circuit diagram depicting the memory cell array 1 of FIG. 10.

Referring to FIG. 11, the memory cell array 1 may include a plurality of word lines WL, a plurality of bit lines BL1 and BL2, a plurality of source lines SL and a plurality of unit memory cells 10. The bit lines BL1 and BL2 may intersect the word lines WL. As depicted in FIG. 11, the source lines SL may be parallel or substantially parallel to the bit lines BL1 and BL2. However, embodiments of the inventive concepts are not limited thereto. In certain embodiments, the source lines SL may be parallel or substantially parallel to the word lines WL, unlike that depicted in FIG. 11.

Each of the unit memory cells 10 may be connected between one word line WL and a pair of bit lines BL1 and BL2 intersecting the one word line WL. Each of the unit memory cells 10 may include first and second memory elements ME1 and ME2 and first and second selection elements SE1 and SE2.

In greater detail, the first memory element ME1 may be connected between the first selection element SE1 and a first bit line BL1, and the second memory element ME2 may be connected between the second selection element SE2 and a second bit line BL2. The first selection element SE1 may be connected between the first memory element ME1 and the source line SL, and the second selection element SE2 may be connected between the second memory element ME2 and the source line SL. The first and second selection elements SE1 and SE2 may share one source line SL and may be controlled by the same word line WL. Additionally, the unit memory cells 10 arranged in a first direction D1 or a second direction D2 that is perpendicular or substantially perpendicular to the first direction D1 may be connected in common to the source line SL.

One unit memory cell 10 may be selected by one word line WL and the pair of bit lines BL1 and BL2. In some embodiments, each of the first and second memory elements ME1 and ME2 may be a variable-resistance element that is switchable between two resistive states by an electrical pulse applied thereto. Materials of the first and second memory elements ME1 and ME2 may have resistive values that are changeable by a magnitude and/or a direction of a current or voltage applied to the memory element and may have a non-volatile characteristic capable of retaining the resistive value even though the current or voltage may be interrupted. In some embodiments, the first and second memory elements ME1 and ME2 may have a structure that is configured to exhibit a magnetoresistance property. For example, each of the first and second memory elements ME1 and ME2 may be the magnetic tunnel junction pattern MTJP described with reference to FIG. 9A or 9B. In some embodiments, each of the first and second memory elements ME1 and ME2 may include a perovskite compound or a transition-metal oxide.

Each of the first and second selection elements SE1 and SE2 may be a diode, a PNP bipolar transistor, an NPN bipolar transistor, an NMOS field effect transistor or a PMOS field effect transistor. In some embodiments, the first and second selection elements SE1 and SE2 may control the supply of currents to the first and second memory elements ME1 and ME2 in response to a voltage of the word lines WL.

Figure 12:
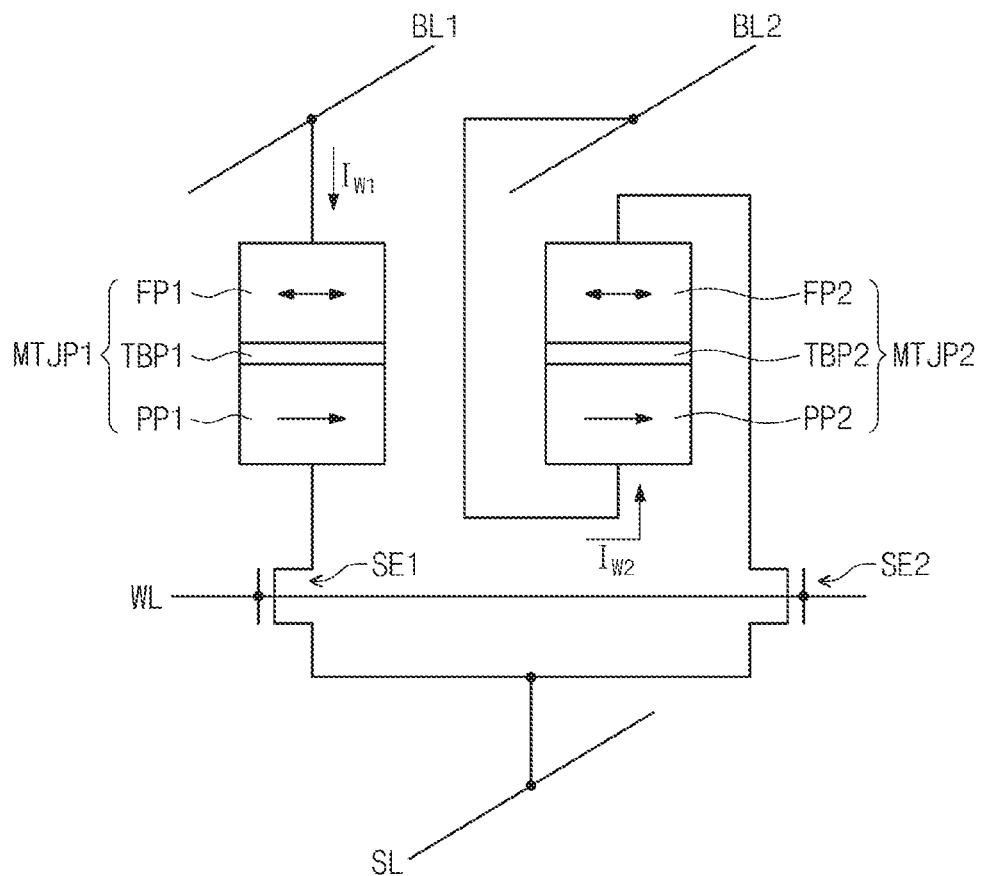
FIG. 12 is a circuit diagram depicting a unit memory cell of a magnetic memory device according to some embodiments of the inventive concepts.

FIG. 12 is a circuit diagram depicting a unit memory cell of a magnetic memory device according to some embodiments of the inventive concepts. In other words, FIG. 12 is a circuit diagram depicting the unit memory cell 10 of FIG. 11.

Referring to FIG. 12, the unit memory cell 10 may include first and second magnetic tunnel junction patterns MTJP1 and MTJP2 that are used as the memory elements and may include first and second selection transistors SE1 and SE2 that are used as the selection elements. The first magnetic tunnel junction pattern MTJP1 may include a first free magnetic pattern FP1, a first pinned magnetic pattern PP1, and a first tunnel barrier pattern TBP1 that is disposed between the first free magnetic pattern FP1 and the first pinned magnetic pattern PP1. The second magnetic tunnel junction pattern MTJP2 may include a second free magnetic pattern FP2, a second pinned magnetic pattern PP2, and a second tunnel barrier pattern TBP2 that is disposed between the second free magnetic pattern FP2 and the second pinned magnetic pattern PP2. Each of the first and second magnetic patterns PP1 and PP2 may have a magnetization direction that is fixed in one direction. The first free magnetic pattern FP1 may have a magnetization direction that changeable to be parallel or anti-parallel to the magnetization direction of the first pinned magnetic pattern PP1, and the second free magnetic pattern FP2 may have a magnetization direction that is changeable to be parallel or anti-parallel to the magnetization direction of the second pinned magnetic pattern PP2. According to some embodiments of the inventive concepts, each of the first and second magnetic tunnel junction patterns MTJP1 and MTJP2 may be the substantially same as the magnetic tunnel junction pattern MTJP described with reference to FIG. 9A or 9B. As depicted in FIG. 12, the first and second magnetic tunnel junction patterns MTJP1 and MTJP2 may have a horizontal magnetic anisotropy. It should be understood, however, that the first and second magnetic tunnel junction patterns MTJP1 and MTJP2 may have a vertical magnetic anisotropy.

The first and second bit lines BL1 and BL2 may intersect the word line WL, and the source line SL may be connected in common to the first and second transistors SE1 and SE2. The first magnetic tunnel junction pattern MTJP1 may be connected between the first bit line BL1 and the first selection transistor SE1, and the first selection transistor SE1 may be connected between the first magnetic tunnel junction pattern MTJP1 and the source line SL. The second magnetic tunnel junction pattern MTJP2 may be connected between the second bit line BL2 and the second selection transistor SE2, and the second selection transistor SE2 may be connected between the second magnetic tunnel junction pattern MTJP2 and the source line SL.

In some embodiments, as depicted in FIG. 12, the first free magnetic pattern FP1 may be connected to the first bit line BL1, and the first pinned magnetic pattern PP1 may be connected to the first selection transistor SE1. Additionally, the second free magnetic pattern FP2 may be connected to the second selection transistor SE2, and the second pinned magnetic pattern PP2 may be connected to the second bit line BL2.

In some embodiments, unlike that depicted in FIG. 12, the first pinned magnetic pattern PP1 may be connected to the first bit line BL1, and the first free magnetic pattern FP1 may be connected to the first selection transistor SE1. Additionally, the second pinned magnetic pattern PP2 may be connected to the second selection transistor SE2, and the second free magnetic pattern FP2 may be connected to the second bit line BL2. The unit memory cell 10 depicted in FIG. 12 will be described as an example for the purpose of ease and convenience in explanation.

In some embodiments, to write data "1" into a selected unit memory cell 10, a turn-on voltage may be applied to the word line WL that is connected to the selected unit memory cell 10. A first bit line voltage may be applied to the first and second bit lines BL1 and BL2, and a first source line voltage that is less than the first bit line voltage may be applied to the source line SL.

Under these voltage conditions, the first and second selection transistors SE1 and SE2 may be turned on to electrically connect the first and second magnetic tunnel junction patterns MTJP1 and MTJP2 to the source line SL. A first write current $I_{W1}$ flowing from the first bit line BL1 to the source line SL may be provided to the first magnetic tunnel junction pattern MTJP1. Similarly, a second write current $I_{W2}$ flowing from the second bit line BL2 to the source line SL may be provided to the second magnetic tunnel junction pattern MTJP2. Here, the flowing direction of the first write current $I_{W1}$ may be opposite to the flowing direction of the second write current $I_{W2}$ from the viewpoint of the first and second magnetic tunnel junction patterns MTJP1 and MTJP2. In other words, when the same voltage is applied to the first and second bit lines BL1 and BL2, write currents that are in opposite directions to each other may be supplied to the first magnetic tunnel junction pattern MTJP1 and the second magnetic tunnel junction pattern MTJP2.

In greater detail, the first write current $I_{W1}$ may be provided in a direction from the first free magnetic pattern FP1 to the first pinned magnetic pattern PP1 of the first magnetic tunnel junction pattern MTJP1, and thus electrons may be provided in a direction from the first pinned magnetic pattern PP1 to the first free magnetic pattern FP1. In this case, electrons having spins in the same direction as the magnetization direction of the first pinned magnetic pattern PP1 may tunnel through the first tunnel barrier pattern TBP1 to apply a torque associated with the electrons to the first free magnetic pattern FP1. Thus, the magnetization direction of the first free magnetic pattern FP1 may be changed to be parallel to the magnetization direction of the first pinned magnetic pattern PP1. Conversely, the second write current $I_{W2}$ may be provided in a direction from the second pinned magnetic pattern PP2 to the second free magnetic pattern FP2 of the second magnetic tunnel junction pattern MTJP2. Thus, electrons may be provided in a direction from the second free magnetic pattern FP2 to the second pinned magnetic pattern PP2. In this case, electrons having spins that are in an opposite direction to the magnetization direction of the second pinned magnetic pattern PP2 may not tunnel through the second tunnel barrier pattern TBP2, but may be reflected from the second tunnel barrier pattern TBP2 into the second free magnetic pattern FP2, and thus a torque associated with the electrons may be applied to the second free magnetic pattern FP2. Thus, the magnetization direction of the second free magnetic pattern FP2 may be changed to be anti-parallel to the magnetization direction of the second pinned magnetic pattern PP2.

If the data "1" is written in the selected unit memory cell 10 as described above, the first magnetic tunnel junction pattern MTJP1 may be written such that the magnetization directions of the first free magnetic pattern FP1 and the first pinned magnetic pattern PP1 are parallel to each other, and the second magnetic tunnel junction pattern MTJP2 may be written such that the magnetization directions of the second free magnetic pattern FP2 and the second pinned magnetic pattern PP2 are anti-parallel to each other. In other words, the first magnetic tunnel junction pattern MTJP1 may have a low-resistive state, and the second magnetic tunnel junction pattern MTJP2 may have a high-resistive state.

In some embodiments, the turn-on voltage may be applied to the word line WL connected to the selected unit memory cell 10 to write data "0" in the selected unit memory cell 10. A second bit line voltage may be applied to the first and second bit lines BL1 and BL2, and a second source line voltage that is greater than the second bit line voltage may be applied to the source line SL.

Under these voltage conditions, the direction of the first write current $I_{W1}$ flowing through the first magnetic tunnel junction pattern MTJP1 may be opposite to the direction of the second write current $I_{W2}$ flowing the second magnetic tunnel junction pattern MTJP2. Thus, if the data "0" is written in the selected unit memory cell 10, the first magnetic tunnel junction pattern MTJP1 may be written such that the magnetization directions of the first free magnetic pattern FP1 and the first pinned magnetic pattern PP1 are anti-parallel to each other, and the second magnetic tunnel junction pattern MTJP2 may be written such that the magnetization directions of the second free magnetic pattern FP2 and the second pinned magnetic pattern PP2 are parallel to each other. In other words, the first magnetic tunnel junction pattern MTJP1 may have a high-resistive state, and the second magnetic tunnel junction pattern MTJP2 may have a low-resistive state.

Since the first and second magnetic tunnel junction patterns MTJP1 and MTJP2 have the resistive states that are different from each other as described above, the resistive value of one of the first and second magnetic tunnel junction patterns MTJP1 and MTJP2 may be used as a reference resistance value when data is read out from the selected unit memory cell 10. In other words, the unit memory cell 10 may have a sensing margin corresponding to a difference between the resistive value of the first magnetic tunnel junction pattern MTJP1 and the resistive value of the second magnetic tunnel junction pattern MTJP2, and thus reliability of the unit memory cell 10 may be improved.

Figure 13:
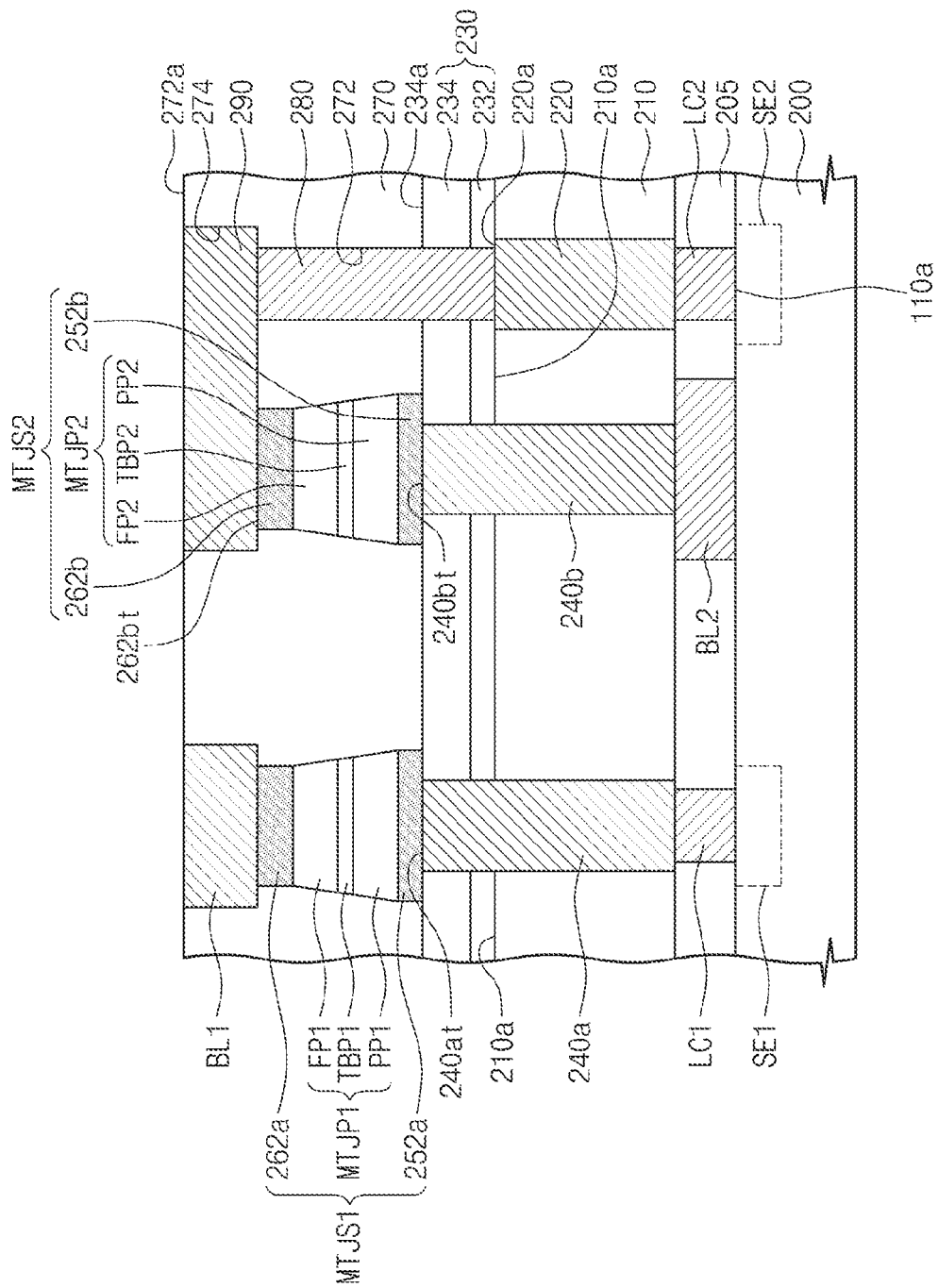
FIG. 13 is a cross-sectional view depicting a unit memory cell of a magnetic memory device according to some embodiments of the inventive concepts.

FIG. 13 is a cross-sectional view depicting a unit memory cell of a magnetic memory device according to some embodiments of the inventive concepts. In particular, FIG. 13 is a cross-sectional view corresponding to the unit memory cell of FIG. 12.

Referring to FIG. 13, a substrate 200 may be provided. The substrate 200 may include first and second selection transistors SE1 and SE2. The first and second selection transistors SE1 and SE2 may be controlled by a single word line (not shown). Additionally, a source line (not shown) may be further provided to be connected in common to a source region of the first selection transistor SE1 and a source region of the second selection transistor SE2.

A first lower interlayer insulating layer 205 may be disposed on the substrate 200. The first lower interlayer insulating layer 205 may include at least one of silicon oxide, silicon nitride, silicon oxynitride or a low-k dielectric material or a combination thereof. First and second lower contacts LC1 and LC2, and a second bit line BL2 may be provided in the first lower interlayer insulating layer 205. The first lower contact LC1 may penetrate the first lower interlayer insulating layer 205 to be electrically connected to a drain region (not indicated) of the first selection transistor SE1 that is included in the substrate 200. The second lower contact LC2 may penetrate the first lower interlayer insulating layer 205 to be electrically connected to a drain region (not indicated) of the second selection transistor SE2 that is included in the substrate 200. Each of the first and second lower contacts LC1 and LC2 may include at least one of a semiconductor material doped with dopants (e.g., doped silicon), a metal (e.g., tungsten, titanium, or tantalum), a conductive metal nitride (e.g., titanium nitride, tantalum nitride, or tungsten nitride) or a metal-semiconductor compound (e.g., a metal silicide). The second bit line BL2 may include a metal, such as copper, aluminum, tungsten, titanium or a combination thereof.

A second lower interlayer insulating layer 210 may be disposed on the first lower interlayer insulating layer 205. The second lower interlayer insulating layer 210 may include at least one of silicon oxide, silicon nitride, silicon oxynitride, a low-k dielectric material or a combination thereof.

A mold insulating layer 230 may be disposed on the second lower interlayer insulating layer 210. The mold insulating layer 230 may include a first mold insulating layer 232 and a second mold insulating layer 234 that are sequentially stacked on the second lower interlayer insulating layer 210. The first mold insulating layer 232 may be formed by the same or a similar method as the first mold insulating layer 132 described with reference to FIGS. 2 to 6, and may include the same or a similar material as the first mold insulating layer 132 of FIGS. 2 to 6. Similarly, the second mold insulating layer 234 may be formed by the same or a similar method as the second mold insulating layer 134 of FIGS. 2 to 6, and may include the same or a similar material as the second mold insulating layer 134 of FIGS. 2 to 6. In other words, the first mold insulating layer 232 may be an insulating layer formed by an ALD process that is performed at about room temperature, and the second mold insulating layer 234 may be an insulating layer formed by a CVD process that is performed at a temperature greater than room temperature. In some embodiments, the first and second mold insulating layers 232 and 234 may be silicon oxide layers having characteristics that are different from each other. In certain embodiments, the first mold insulating layer 232 may be a silicon nitride layer, and the second mold insulating layer 234 may be a silicon oxide layer.

A shallow contact 220, a first deep contract 240a and a second deep contact 240b may be disposed on the substrate 200. The shallow contact 220 may penetrate the second lower interlayer insulating layer 210 to be electrically connected to the second lower contact LC2. A top surface 220a of the shallow contact 220 may be disposed at the substantially same level as a top surface 210a of the second lower interlayer insulating layer 210. The first deep contact 240a may penetrate the mold insulating layer 230 and the second lower interlayer insulating layer 210 to be electrically connected to the first lower contact LC1. The second deep contact 240b may penetrate the mold insulating layer 230 and the second lower interlayer insulating layer 210 to be electrically connected to the second bit line BL2. Respective top surfaces 240at and 240bt of the first and second deep contacts 240a and 240b may be disposed at substantially same level as a top surface 234a of the second mold insulating layer 234. In other words, the respective top surfaces 240at and 240bt of the first and second deep contacts 240a and 240b may be higher than the top surface 220a of the shallow contact 220. The shallow contact 220 may be formed by the same or a similar method as the first conductive pattern 120 described with reference to FIGS. 1 to 6, and may include the same or a similar material as the first conductive pattern 120 of FIGS. 1 to 6. The first and second deep contacts 240a and 240b may be formed by the same or a similar method as the second conductive pattern 140 described with reference to FIGS. 1 to 6, and may include the same or a similar material as the second conductive pattern 140 of FIGS. 1 to 6. In other words, each of the shallow contact 220 and the first and second deep contacts 240a and 240b may include a metal, such as copper, aluminum, tungsten, titanium or a combination thereof. In some embodiments, the shallow contact 220 and the first and second deep contacts 240a and 240b may include tungsten.

A first magnetic tunnel junction structure MTJS1 may be disposed on the first deep contact 240a. The first magnetic tunnel junction structure MTJS1 may include a first bottom electrode 252a, a first magnetic tunnel junction pattern MTJP1, and a first top electrode 262a that are sequentially stacked on the first deep contact 240a. The first bottom electrode 252a may be in electrical contact with the first deep contact 240a. That is, the first magnetic tunnel junction structure MTJS1 may be electrically connected to the first deep contact 240a. A second magnetic tunnel junction structure MTJS2 may be disposed on the second deep contact 240b. The second magnetic tunnel junction structure MTJS2 may include a second bottom electrode 252b, a second magnetic tunnel junction pattern MTJP2, and a second top electrode 262b that are sequentially stacked on the second deep contact 240b. The second bottom electrode 252b may be in electrical contact with the second deep contact 240b. That is, the second magnetic tunnel junction structure MTJ2 may be electrically connected to the second deep contact 240b.

Each of the first and second bottom electrodes 252a and 252b may include at least one of a conductive metal nitride (e.g., titanium nitride or tantalum nitride), a transition metal (e.g., titanium or tantalum) or a rare-earth metal (e.g., ruthenium or platinum). Each of the first and second top electrodes 262a and 262b may include at least one of tungsten, tantalum, aluminum, copper, gold, silver, titanium a metal nitride (e.g., titanium nitride or tantalum nitride) or a combination thereof.

The first magnetic tunnel junction pattern MTJP1 may include a first free magnetic pattern FP1, a first pinned magnetic pattern PP1, and a first tunnel barrier pattern TBP1 that is disposed between the first free magnetic pattern FP1 and the first pinned magnetic pattern PP1. In one embodiment, the first magnetic tunnel junction pattern MTJP1 may have a horizontal magnetization anisotropy. In another embodiment, the first magnetic tunnel junction pattern MTJP1 may have a vertical magnetization anisotropy. The second magnetic tunnel junction pattern MTJP2 may include a second free magnetic pattern FP2, a second pinned magnetic pattern PP2, and a second tunnel barrier pattern TBP2 that is disposed between the second free magnetic pattern FP2 and the second pinned magnetic pattern PP2. In one embodiment, the second magnetic tunnel junction pattern MTJP2 may have a horizontal magnetization anisotropy. In another embodiment, the second magnetic tunnel junction pattern MTJP2 may have a vertical magnetization anisotropy. A stacking order of the first pinned magnetic pattern PP1, the first tunnel barrier pattern TBP1, and the first free magnetic pattern FP1 may be the same as a stacking order of the second pinned magnetic pattern PP2, the second tunnel barrier pattern TBP2, and the second free magnetic pattern FP2. Thus, as described with reference to FIG. 12, the first pinned magnetic pattern PP1 may be electrically connected to the drain region of first selection transistor SE1 through the first deep contact 240a and the first lower contact LC1. The second pinned magnetic pattern PP2 may be electrically connected to the second bit line BL2 through the second deep contact 240b.

An upper interlayer insulating layer 270 may be disposed on the mold insulating layer 230. The upper interlayer insulating layer 270 may be formed by the same or a similar method as used to form the upper interlayer insulating layer 170 that is described with reference to FIG. 6, and may include the same or a similar material as used in the upper interlayer insulating layer 170 that is described with reference to FIG. 6. Unlike the upper interlayer insulating layer 170 of FIG. 6, the upper interlayer insulating layer 270 according to the present embodiment may cover the first and second magnetic tunnel junction structures MTJS1 and MTJS2. The upper interlayer insulating layer 270 may include at least one of silicon oxide, silicon nitride, silicon oxynitride, a low-k dielectric material or a combination thereof.

A connection contact 280 may penetrate the upper interlayer insulating layer 270 and the mold insulating layer 230 so to be electrically connected to the shallow contact 220. A first bit line BL1 and a connection line pattern 290 may be provided in the upper interlayer insulating layer 270. The first bit line BL1 may be electrically connected to the first top electrode 262a. The connection line pattern 290 may be in electrical contact with both the second top electrode 262b and the connection contact 280. In other words, the connection line pattern 290 may be electrically connected to the second top electrode 262b and the connection contact 280. Thus, the first free magnetic pattern FP1 may be electrically connected to the first bit line BL1 through the first top electrode 262a. The second free magnetic pattern FP2 may be electrically connected to the drain region of the second selection transistor SE2 through the second top electrode 262b, the connection line pattern 290, the connection contact 280, the shallow contact 220 and the second lower contact LC2, as described with reference to FIG. 12. The connection contact 280 may be formed by the same or a similar method used to form as the third conductive pattern 180 of FIG. 6, and may include the same or a similar material as used to form the third conductive pattern 180 of FIG. 6. For example, the connection contact 280 may include a metal, such as copper, aluminum, tungsten, titanium or a combination thereof. In some embodiments, the connection contact 280 may include copper. The first bit line BL1 and the connection line pattern 290 may include the same material as used to form the connection contact 280. For example, the first bit line BL1 and the connection line pattern 290 may include copper.

In some embodiments, the connection contact 280 and the connection line pattern 290 may be formed using a double damascene process. In greater detail, forming the connection contact 280 and the connection line pattern 290 may include forming a connection contact hole 272 that penetrates the upper interlayer insulating layer 270 and the mold insulating layer 230 to expose the shallow contact 220. A connection trench 274 is formed that is connected to the connection contact hole 272 and exposes a top surface 262bt of the second top electrode 262b in the upper interlayer insulating layer 270. A fourth conductive layer is formed that fills the connection contact hole 272 and the connection trench 274. The fourth conductive layer is planarized until a top surface 270a of the upper interlayer insulating layer 270 is exposed. In the present embodiment, the connection contact or via hole 272 may be formed before the formation of the connection trench 274. However, embodiments of the inventive concepts are not limited thereto. In certain embodiments, the connection contact hole 272 may be formed after the formation of the connection trench 274. The connection contact 280 may correspond to a portion of the fourth conductive layer, which fills the connection contact hole 272. The connection line pattern 290 may correspond to another portion of the fourth conductive layer, which fills the connection trench 274. In other words, the connection contact 280 and the connection line pattern 290 may be connected to each other to constitute one body.

According to some embodiments of the inventive concepts, an upper portion 220a of the shallow contact 220 may be prevented from being oxidized by a subsequent oxidation process (e.g., a process of forming the first mold insulating layer 232), thereby reducing or minimizing a contact resistance between the shallow contact 220 and the connection contact 280 that is in contact with the shallow contact 220. As a result, the electrical characteristics of the magnetic memory device may be improved.

The magnetic memory device according to some embodiments of the inventive concepts may include the magnetic tunnel junction pattern that is electrically connected to the bit line and the selection element through the contacts having heights that are different from each other. According to some embodiments of the inventive concepts, an upper portion of a relatively low-height contact with respect to the surface of the substrate may be prevented from being oxidized in a subsequent process, thereby reducing or minimizing the contact resistance between the low-height contact and another contact that is in contact with the low-height contact. As a result, the electrical characteristics of the magnetic memory device may be improved.

Figure 14:
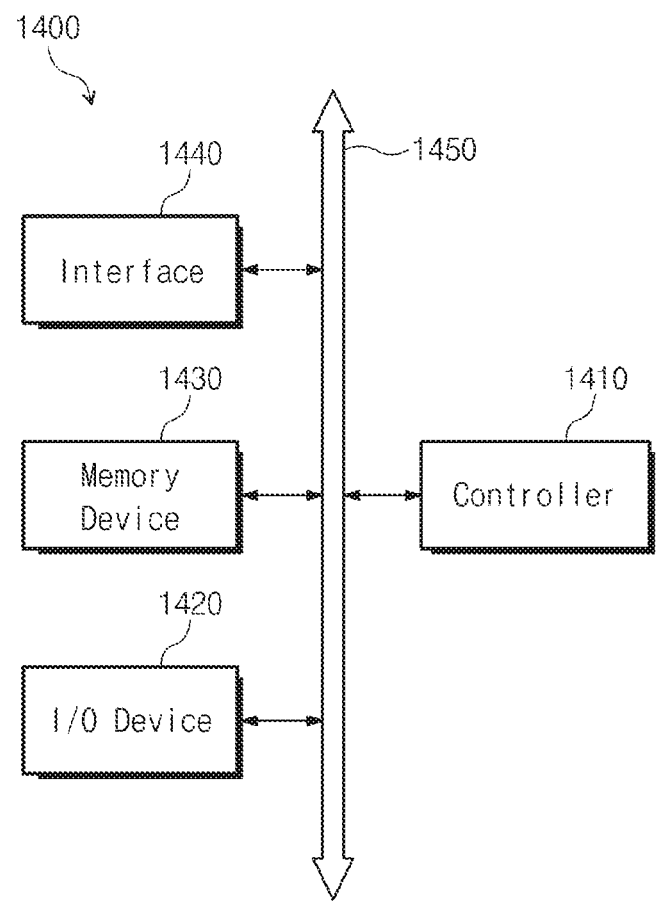
FIG. 14 depicts an electronic device that comprises one or more integrated circuits (chips) comprising a magnetic memory device in accordance with example embodiments.

FIG. 14 depicts an electronic device 1400 that comprises one or more integrated circuits (chips) comprising a semiconductor device that includes a magnetic memory device according to embodiments disclosed herein. Electronic device 1400 may be used in, but not limited to, a computing device, a personal digital assistant (PDA), a laptop computer, a mobile computer, a web tablet, a wireless phone, a cell phone, a smart phone, a digital music player, or a wireline or wireless electronic device. The electronic device 1400 may comprise a controller 1410, an input/output device 1420 such as, but not limited to, a keypad, a keyboard, a display, or a touch-screen display, a memory 1430, and a wireless interface 1440 that are coupled to each other through a bus 1450. The controller 1410 may comprise, for example, at least one microprocessor, at least one digital signal process, at least one microcontroller, or the like. The memory 1430 may be configured to store a command code to be used by the controller 1410 or a user data. Electronic device 1400 and the various system components comprising a semiconductor device that includes a magnetic memory device according to embodiments disclosed herein. The electronic device 1400 may use a wireless interface 1440 configured to transmit data to or receive data from a wireless communication network using a RF signal. The wireless interface 1440 may include, for example, an antenna, a wireless transceiver and so on. The electronic system 1400 may be used in a communication interface protocol of a communication system, such as, but not limited to, Code Division Multiple Access (CDMA), Global System for Mobile Communications (GSM), North American Digital Communications (NADC), Extended Time Division Multiple Access (E-TDMA), Wideband CDMA (WCDMA), CDMA2000, Wi-Fi, Municipal Wi-Fi (Muni Wi-Fi), Bluetooth, Digital Enhanced Cordless Telecommunications (DECT), Wireless Universal Serial Bus (Wireless USB), Fast low-latency access with seamless handoff Orthogonal Frequency Division Multiplexing (Flash-OFDM), IEEE 802.20, General Packet Radio Service (GPRS), iBurst, Wireless Broadband (WiBro), WiMAX, WiMAX-Advanced, Universal Mobile Telecommunication Service—Time Division Duplex (UMTS-TDD), High Speed Packet Access (HSPA), Evolution Data Optimized (EVDO), Long Term Evolution-Advanced (LTE-Advanced), Multichannel Multipoint Distribution Service (MMDS), and so forth.

Figure 15:
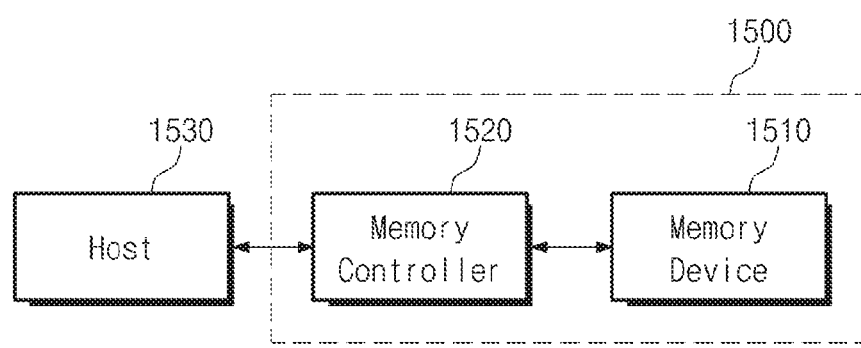
FIG. 15 depicts a memory system that may comprise one or more integrated circuits (chips) comprising a semiconductor device that includes a magnetic memory device in accordance with example embodiments.

FIG. 15 depicts a memory system 1500 that may comprise one or more integrated circuits (chips) comprising a semiconductor device that includes magnetic memory device according to embodiments disclosed herein. The memory system 1500 may comprise a memory device 1510 for storing large amounts of data and a memory controller 1520. The memory controller 1520 controls the memory device 1510 to read data stored in the memory device 1510 or to write data into the memory device 1510 in response to a read/write request of a host 1530. The memory controller 1520 may include an address-mapping table for mapping an address provided from the host 1530 (e.g., a mobile device or a computer system) into a physical address of the memory device 1510. The memory device 1510 may comprise one or more semiconductor devices a semiconductor device that includes a magnetic memory device according to embodiments disclosed herein.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A method for manufacturing a magnetic memory device, the method comprising:
   forming a first interlayer insulating layer on a substrate;
   forming a first conductive pattern that penetrates the first interlayer insulating layer;
   forming a mold insulating layer on the first interlayer insulating layer, the mold insulating layer comprising: a first mold insulating layer in contact with the first conductive pattern; and a second mold insulating layer on the first mold insulating layer;
   forming a second conductive pattern that penetrates the first and second mold insulating layers and the first interlayer insulating layer;
   forming a magnetic tunnel junction pattern on the second conductive pattern;
   forming a second interlayer insulating layer that covers the magnetic tunnel junction pattern on the second mold insulating layer; and
   forming a third conductive pattern that penetrates the second interlayer insulating layer, the second mold insulating layer, and the first mold insulating layer to be in contact with the first conductive pattern,
   wherein the first mold insulating layer is formed by a first process at a first temperature,
   wherein the second mold insulating layer is formed by a second process that is different from the first process at a second temperature that is greater than the first temperature,
   wherein the first temperature is about room temperature,
   wherein the first conductive pattern extends from a top surface to a bottom surface of the first interlayer insulating layer, and
   wherein the second conductive pattern extends from a top surface of the second mold insulating layer to the bottom surface of the first interlayer insulating layer.

2. The method of claim 1, wherein the first process is an atomic layer deposition (ALD) process, and
   wherein the second process is a chemical vapor deposition (CVD) process.

3. The method of claim 2, wherein the second temperature has a range from about 300° C. to about 500° C.

4. The method of claim 1, wherein the first conductive pattern and the third conductive pattern include metals that are different from each other.

5. The method of claim 4, wherein the metal of the third conductive pattern has a lower melting point and a lower resistivity than the metal of the first conductive pattern.

6. The method of claim 5, wherein the first conductive pattern includes tungsten, and
   wherein the third conductive pattern includes copper.

7. The method of claim 5, wherein the second conductive pattern includes a same metal as the first conductive pattern.

8. A method to form a magnetic memory device, the method comprising:
- forming a lower interlayer insulating layer on a substrate;
- forming at least one first conductive pattern in lower interlayer insulating layer;
- forming a first mold insulating layer on the lower interlayer insulating layer, the first mold insulating layer comprising a first thin-layer characteristic;
- forming a second mold insulating layer on the first mold insulating layer, the second mold insulating layer comprising a second thin-layer characteristic that is different from the first thin-layer characteristic;
- forming at least one second conductive pattern that extends through the first mold insulating layer, the second mold insulating layer, the lower interlayer insulating layer to contact the substrate;
- forming a first magnetic tunnel junction pattern disposed on the second mold insulating layer, the first magnetic tunnel junction pattern being electrically connected to the at least one second conductive pattern;
- forming an upper interlayer insulating layer on the second mold insulating layer; and
- forming at least one third conductive pattern that extends through the upper interlayer insulating layer, the second mold insulating layer and the first mold insulating layer to be electrically connected to the at least one first conductive pattern,
- wherein a top surface of the at least one first conductive pattern comprises a recessed region, and
- wherein the at least one third conductive pattern is in contact with the recessed region of the at least one first conductive pattern.

9. The method of claim 8, wherein a refractive index of the first mold insulating layer is lower than a refractive index of the second mold insulating layer.

10. The method of claim 8, wherein each of the first mold insulating layer and the second mold insulating layer comprises a compressive stress, and
- wherein a magnitude of the compressive stress of the first mold insulating layer is less than a magnitude of the compressive stress of the second mold insulating layer.

11. The method of claim 8, wherein a density of the first mold insulating layer is less than a density of the second mold insulating layer.

12. The method of claim 8, wherein the first mold insulating layer and the second mold insulating layer comprises silicon oxide.

13. The method of claim 8, wherein the first mold insulating layer and the second mold insulating layer comprises materials that are different from each other.

14. The method of claim 8, wherein the at least one second conductive pattern comprises a same metal as the at least one first conductive pattern.

15. The method of claim 8, wherein the first mold insulating layer is formed by an atomic layer deposition (ALD) process, and
- wherein the second mold insulating layer is formed by a chemical vapor deposition (CVD) process.

16. The method of claim 15, wherein the ALD process that forms first mold insulating layer is performed at about room temperature; and
- wherein the CVD process that forms the second mold insulating layer is performed in a temperature range from about 300° C. to about 500° C.

* * * * *